(12) United States Patent
Cao et al.

(10) Patent No.: US 11,848,710 B2
(45) Date of Patent: Dec. 19, 2023

(54) RECEIVER OPTICAL SUB-ASSEMBLY, BI-DIRECTIONAL OPTICAL SUB-ASSEMBLY, OPTICAL MODULE, AND OPTICAL NETWORK DEVICE

(71) Applicant: HUAWEI TECHNOLOGIES CO., LTD., Guangdong (CN)

(72) Inventors: Rixiang Cao, Dongguan (CN); Yu Xiong, Shenzhen (CN); Zelin Wang, Dongguan (CN); Zhe Yu, Dongguan (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 71 days.

(21) Appl. No.: 17/557,450

(22) Filed: Dec. 21, 2021

(65) Prior Publication Data

US 2022/0158740 A1 May 19, 2022

Related U.S. Application Data

(63) Continuation of application No. PCT/CN2020/097010, filed on Jun. 19, 2020.

(30) Foreign Application Priority Data

Jun. 21, 2019 (CN) .......................... 201910544063.6

(51) Int. Cl.
*H04B 10/06* (2006.01)
*H04B 10/40* (2013.01)
(Continued)

(52) U.S. Cl.
CPC .............. *H04B 10/67* (2013.01); *H03F 3/08* (2013.01); *H04B 10/40* (2013.01); *H04B 10/691* (2013.01); *H04B 10/697* (2013.01)

(58) Field of Classification Search
None
See application file for complete search history.

(56) References Cited

U.S. PATENT DOCUMENTS

| 5,459,311 A | 10/1995 | Brosnan |
| 2006/0034621 A1* | 2/2006 | Denoyer .................. H03F 1/30 398/208 |

(Continued)

FOREIGN PATENT DOCUMENTS

| CN | 1574711 A | 2/2005 |
| CN | 1977473 A | 6/2007 |

(Continued)

OTHER PUBLICATIONS

Extended European Search Report issued in European Application No. 20827800.2 dated Jul. 11, 2022, 8 pages.

(Continued)

*Primary Examiner* — Darren E Wolf
(74) *Attorney, Agent, or Firm* — Fish & Richardson P.C.

(57) ABSTRACT

This application provides a receiver optical sub-assembly, a bi-directional optical sub-assembly, and an optical network device to improve anti-electromagnetic crosstalk performance of the receiver optical sub-assembly. The receiver optical sub-assembly includes: a photodiode, a trans-impedance amplifier, and a first filter component. The photodiode is configured to convert an optical signal into an electrical signal, a positive electrode of the photodiode is connected to an input terminal of the trans-impedance amplifier, and a negative electrode of the photodiode is configured to connect to a power supply. The trans-impedance amplifier is configured to amplify the electrical signal output by the photodiode, a power terminal of the trans-impedance amplifier is configured to connect to a power supply, and a first (Continued)

ground terminal of the trans-impedance amplifier is configured to connect to an external ground.

18 Claims, 21 Drawing Sheets

(51) Int. Cl.
*H04B 10/69* (2013.01)
*H03F 3/08* (2006.01)
*H04B 10/67* (2013.01)

(56) References Cited

U.S. PATENT DOCUMENTS

| | | | |
|---|---|---|---|
| 2007/0258087 A1* | 11/2007 | Ogura | G01K 11/32 374/E11.015 |
| 2011/0031571 A1* | 2/2011 | Bouisse | H03F 3/601 257/E31.11 |
| 2011/0311232 A1 | 12/2011 | Morita et al. | |
| 2015/0245114 A1* | 8/2015 | Ho | H04B 10/503 398/67 |
| 2019/0173588 A1 | 6/2019 | Ahmed et al. | |

FOREIGN PATENT DOCUMENTS

| | | |
|---|---|---|
| CN | 201508182 U | 6/2010 |
| CN | 201584972 U | 9/2010 |
| CN | 103746748 A | 4/2014 |
| EP | 3474467 A1 | 4/2019 |
| JP | 2004254125 A | 9/2004 |
| JP | 2008507943 A | 3/2008 |
| JP | 2009505457 A | 2/2009 |
| JP | 2009527904 A | 7/2009 |
| JP | 2012004954 A | 1/2012 |
| JP | 2015517774 A | 6/2015 |
| JP | 2017183391 A | 10/2017 |

OTHER PUBLICATIONS

Office Action issued in Chinese Application No. 201910544063.6 dated May 7, 2021, 17 pages (with English translation).
PCT International Search Report and Written Opinion issued in International Application No. PCT/CN2020/097010 dated Aug. 26, 2020, 17 pages (with English translation).
Office Action in Japanese Appln. No. 2021-576116, dated Feb. 6, 2023, 7 pages (with English translation).

* cited by examiner

RECEIVER OPTICAL SUB-ASSEMBLY, BI-DIRECTIONAL OPTICAL SUB-ASSEMBLY, OPTICAL MODULE, AND OPTICAL NETWORK DEVICE

CROSS-REFERENCE TO RELATED APPLICATIONS

This application is a continuation of International Application No. PCT/CN2020/097010, filed on Jun. 19, 2020, which claims priority to Chinese Patent Application No. 201910544063.6, filed on Jun. 21, 2019. The disclosures of the aforementioned applications are hereby incorporated by reference in their entireties.

TECHNICAL FIELD

This application relates to the optical communication field, and in particular, to a receiver optical sub-assembly, a bi-directional optical sub-assembly, an optical module, and an optical network device.

BACKGROUND

With advent of the big data era, an information volume is exploding, and a requirement on a network throughput is increasingly becoming higher. Optical communications networks have become the mainstream of modern communication solutions by virtue of advantages such as ultra-high bandwidth and low electromagnetic interference. Access networks represented by fiber to the home are being deployed on a large scale. The optical communications networks mainly exist in forms of passive optical networks (passive optical network, PON). Optical network devices in the PONs include an optical line terminal (optical line terminal, OLT), an optical network unit (optical network unit, ONU), and the like.

A receiver optical sub-assembly is an essential component in an optical network device. The receiver optical sub-assembly is configured to receive an optical signal and convert the optical signal into an electrical signal. Because the receiver optical sub-assembly is usually located in a complex electromagnetic radiation environment, electromagnetic crosstalk of the electromagnetic radiation to a communication signal of the receiver optical sub-assembly cannot be ignored. How to reduce the electromagnetic crosstalk to the receiver optical sub-assembly is a problem that urgently needs to be resolved in the industry.

SUMMARY

This application provides a receiver optical sub-assembly, a bi-directional optical sub-assembly, an optical module, and an optical network device to improve anti-electromagnetic crosstalk performance of the receiver optical sub-assembly.

According to a first aspect, a receiver optical sub-assembly is provided. The receiver optical sub-assembly includes: a photodiode, a trans-impedance amplifier, and a first filter component. The photodiode is configured to convert an optical signal into an electrical signal, a positive electrode of the photodiode is connected to an input terminal of the trans-impedance amplifier, and a negative electrode of the photodiode is configured to connect to a power supply. The trans-impedance amplifier is configured to amplify the electrical signal output by the photodiode, a power terminal of the trans-impedance amplifier is configured to connect to a power supply, and a first ground terminal of the trans-impedance amplifier is configured to connect to an external ground. A first terminal of the first filter component is connected to a second ground terminal of the trans-impedance amplifier, and a second terminal of the first filter component is configured to connect to the external ground.

In this embodiment of this application, the first ground terminal of the trans-impedance amplifier is connected to the external ground to implement direct current grounding. In addition, the first filter component is disposed between the second ground terminal of the trans-impedance amplifier and the external ground to implement alternating current grounding. The first filter component can filter out an electromagnetic crosstalk signal from a ground, thereby improving anti-electromagnetic interference performance of the receiver optical sub-assembly.

With reference to the first aspect, in a possible implementation, the receiver optical sub-assembly further includes a base, the base is configured to connect to the external ground, the first ground terminal of the trans-impedance amplifier is connected to the external ground through the base, and the second terminal of the first filter component is connected to the external ground through the base.

In this embodiment of this application, the receiver optical sub-assembly includes the base, and the base may be connected to the external ground. Various components or elements in the receiver optical sub-assembly, for example, the trans-impedance amplifier or various filter components, may be connected to the external ground through the base. In this way, a grounding function of an internal element of the receiver optical sub-assembly is implemented, and a structure of the receiver optical sub-assembly is optimized.

With reference to the first aspect, in a possible implementation, the receiver optical sub-assembly further includes a second filter component, a first terminal of the second filter component is connected to the negative electrode of the photodiode, and a second terminal of the second filter component is connected to the first terminal of the first filter component.

In this embodiment of this application, the second filter component and the first filter component can filter out a crosstalk signal from a power terminal of the photodiode. In addition, the second filter component, the photodiode, and the trans-impedance amplifier may further form an independent signal loop, so that a loop of a high frequency signal does not pass through the base. Electromagnetic crosstalk from the power supply is suppressed, and electromagnetic crosstalk from a base ground (base GND) or the trans-impedance amplifier is also isolated and absorbed, thereby implementing full path isolation of an entire trans-impedance amplification loop of the receiver optical sub-assembly from the electromagnetic crosstalk, and improving the anti-electromagnetic crosstalk performance.

With reference to the first aspect, in a possible implementation, the receiver optical sub-assembly further includes a third filter component, a first terminal of the third filter component is connected to the power terminal of the trans-impedance amplifier, and a second terminal of the third filter component is connected to the second ground terminal of the trans-impedance amplifier.

In this embodiment of this application, the first filter component and the third filter component can filter out a crosstalk signal from the power terminal of the trans-impedance amplifier. In addition, the third filter component and the trans-impedance amplifier may further form an independent signal loop, so that a loop of a high frequency signal does not pass through the base. Electromagnetic crosstalk from the power supply is suppressed, and electromagnetic crosstalk from a base ground (base GND) or the trans-impedance amplifier is also isolated and absorbed, thereby improving the anti-electromagnetic crosstalk performance.

With reference to the first aspect, in a possible implementation, the receiver optical sub-assembly further includes a fourth filter component, a first terminal of the fourth filter component is connected to the second terminal of the third filter component, and a second terminal of the fourth filter component is connected to the external ground.

In this embodiment of this application, the third filter component and the fourth filter component can filter out a crosstalk signal from the power terminal of the trans-impedance amplifier. In addition, the third filter component and the trans-impedance amplifier may also form an independent signal loop, so that a loop of a high frequency signal does not pass through the base. Electromagnetic crosstalk from the power supply is suppressed, and electromagnetic crosstalk from a base ground (base GND) or a ground terminal of the trans-impedance amplifier is also isolated and absorbed, thereby improving the anti-electromagnetic crosstalk performance.

With reference to the first aspect, in a possible implementation, the receiver optical sub-assembly further includes a fifth filter component, a first terminal of the fifth filter component is connected to the power terminal of the trans-impedance amplifier, and a second terminal of the fifth filter component is connected to the external ground.

In this embodiment of this application, the fifth filter component may be configured to suppress a crosstalk signal from the power terminal of the trans-impedance amplifier, thereby improving the anti-electromagnetic crosstalk performance of the receiver optical sub-assembly.

With reference to the first aspect, in a possible implementation, the receiver optical sub-assembly further includes a sixth filter component, a first terminal of the sixth filter component is connected to the negative electrode of the photodiode, and a second terminal of the sixth filter component is connected to the external ground.

In this embodiment of this application, the sixth filter component may be configured to suppress a crosstalk signal from the power terminal of the photodiode, thereby improving the anti-electromagnetic crosstalk performance of the receiver optical sub-assembly.

With reference to the first aspect, in a possible implementation, a capacitance of the first filter component is greater than 100 pF.

In this embodiment of this application, crosstalk signals from the base ground and the ground terminal of the trans-impedance amplifier can be absorbed and isolated by using the large capacitance of the first filter component, so that electromagnetic crosstalk from the ground can be filtered out.

With reference to the first aspect, in a possible implementation, a scattering parameter of the first filter component on a crosstalk signal frequency band is greater than 20 dB.

In this embodiment of this application, a greater scattering parameter of the first filter component may be set on the crosstalk signal frequency band, so that the first filter component has a stronger filtering function on a crosstalk signal.

With reference to the first aspect, in a possible implementation, the first filter component includes a capacitor.

With reference to the first aspect, in a possible implementation, the second ground terminal of the trans-impedance amplifier includes an input stage ground terminal of the trans-impedance amplifier.

In this embodiment of this application, the input stage ground terminal of the trans-impedance amplifier is used as the second ground terminal, so that an electromagnetic crosstalk signal from the ground can be filtered out at an input stage of the trans-impedance amplifier, that is, before a trans-impedance amplification function. In this way, a stronger impact of electromagnetic crosstalk caused by a crosstalk signal amplified by the trans-impedance amplifier can be avoided, and the anti-electromagnetic interference performance is optimized.

With reference to the first aspect, in a possible implementation, the power terminal of the trans-impedance amplifier and the negative electrode of the photodiode are configured to connect to a same outside power supply.

In this embodiment of this application, the power terminal of the trans-impedance amplifier and the negative electrode of the photodiode are connected to the same outside power supply, so that no extra outside power supply needs to be provided. This has an advantage of simplifying a circuit design.

With reference to the first aspect, in a possible implementation, the power terminal of the trans-impedance amplifier and the negative electrode of the photodiode are configured to connect to different outside power supplies.

In this embodiment of this application, the power terminal of the trans-impedance amplifier and the negative electrode of the photodiode are connected to different outside power supplies, so that circuit design flexibility is improved.

With reference to the first aspect, in a possible implementation, the power terminal of the trans-impedance amplifier is configured to connect to an outside power supply, the trans-impedance amplifier includes a voltage regulation module, the voltage regulation module is connected to the power terminal of the trans-impedance amplifier, and the negative electrode of the photodiode is configured to connect to the voltage regulation module.

In this embodiment of this application, the power terminal of the trans-impedance amplifier is connected to the outside power supply, and power is supplied to the photodiode by using the voltage regulation module inside the trans-impedance amplifier, so that no extra outside power supply needs to be provided. This has an advantage of simplifying a circuit design.

It may be understood that any two or more possible implementations of the first aspect may be combined with each other.

According to a second aspect, a bi-directional optical sub-assembly is provided. The bi-directional optical sub-assembly includes the receiver optical sub-assembly according to any one of the first aspect or the possible implementations of the first aspect.

According to a third aspect, an optical module is provided. The optical module includes the bi-directional optical sub-assembly according to the second aspect.

According to a fourth aspect, an optical network device is provided. The optical network device includes the optical module according to the third aspect.

With reference to the fourth aspect, in a possible implementation, the optical network device is an OLT or an ONU.

DESCRIPTION OF EMBODIMENTS

The following describes the technical solutions in this application with reference to the accompanying drawings.

The technical solutions in the embodiments of this application may be applied to various passive optical network (passive optical network, PON) systems, for example, a next-generation PON (next-generation PON, NG-PON), an NG-PON 1, an NG-PON 2, a gigabit-capable PON (gigabit-capable PON, GPON), a 10 gigabit per second PON (10 gigabit per second PON, XG-PON), a 10-gigabit-capable symmetric passive optical network (10-gigabit-capable symmetric passive optical network, XGS-PON), an Ethernet PON (Ethernet PON, EPON), a 10 gigabit per second EPON (10 gigabit per second EPON, 10G-EPON), a next-generation EPON (next-generation EPON, NG-EPON), a wavelength-division multiplexing (wavelength-division multiplexing, WDM) PON, a time and wavelength division multiplexing (time and wavelength division multiplexing, TWDM) PON, a point-to-point (point-to-point, P2P) WDM PON (P2P-WDM PON), an asynchronous transfer mode PON (asynchronous transfer mode PON, APON), a broadband PON (broadband PON, BPON), a 25 gigabit per second PON (25 gigabit per second PON, 25G-PON), a 50 gigabit per second PON (50 gigabit per second PON, 50G-PON), a 100 gigabit per second PON (100 gigabit per second PON, 100G-PON), a 25 gigabit per second EPON (25 gigabit per second EPON, 25G-EPON), a 50 gigabit per second EPON (50 gigabit per second EPON, 50G-EPON), a 100 gigabit per second EPON (100 gigabit per second EPON, 100G-EPON), and a GPON or an EPON of another rate; and may further be applied to an optical network such as an optical transport network (Optical Transport Network, OTN).

Figure 1:
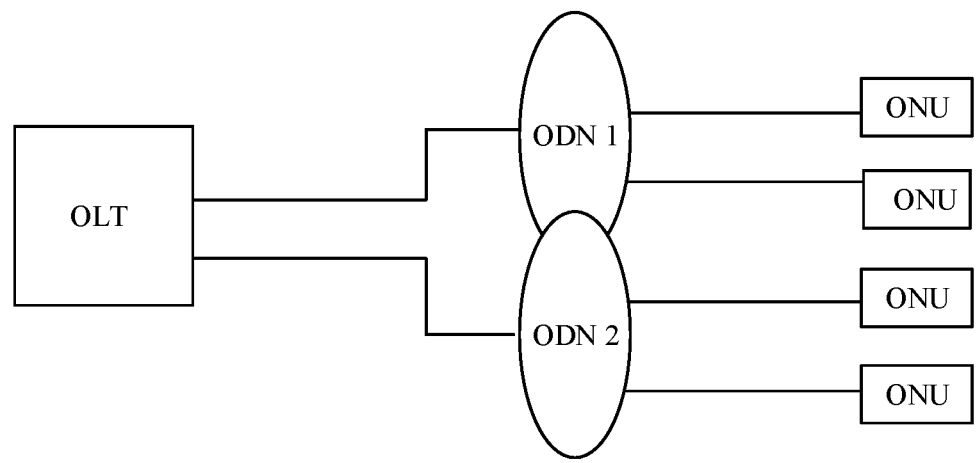
FIG. 1 is a schematic diagram of an application scenario according to an embodiment of this application.

FIG. 1 is a schematic diagram of an application scenario of a passive optical network (PON) according to an embodiment of this application. As shown in FIG. 1, the passive optical network (PON) includes an optical line terminal (optical line terminal, OLT), an optical distribution network (optical distribution network, ODN), and an optical network unit (optical network unit, ONU). The OLT is connected, through the ODN, to a plurality of ONUs disposed on a user side. The OLT and the ONUs each include one or more optical modules. The optical module includes an optical sub-assembly (optical sub-assembly, OSA). A to-be-transmitted analog or digital signal is converted into an optical signal for sending, and the optical signal is received and converted into a corresponding analog or digital signal, so that high-speed optical transmission between the OLT and the ONUs is implemented.

An optical sub-assembly is usually disposed in an optical network device (for example, the OLT or the ONU). The optical sub-assembly is configured to receive and send an optical signal. The optical sub-assembly may include a receiver optical sub-assembly (receiver optical sub-assembly, ROSA) and a transmitter optical sub-assembly (transmitting optical sub-assembly, TOSA), or a bi-directional optical sub-assembly (bi-directional optical sub-assembly, BOSA). The receiver optical sub-assembly is configured to: receive an optical signal and convert the optical signal into an electrical signal. The transmitter optical sub-assembly is configured to: convert an electrical signal into an optical signal, and send the optical signal. The bi-directional optical sub-assembly not only includes a function of the receiver optical sub-assembly, but also includes a function of the transmitter optical sub-assembly. In other words, it may be understood as that the bi-directional optical sub-assembly includes the receiver optical sub-assembly and the transmitter optical sub-assembly. In this embodiment of this application, the receiver optical sub-assembly may also be referred to as an optical receiver. It should be noted that types of the optical module and the optical network device to which the optical sub-assembly is applied are not limited in this embodiment of this application. In addition to the OLT and the ONU, the optical module and the optical sub-assembly in this embodiment of this application may further be applied to an optical network device of another type, for example, an optical switch or a router.

Figure 2:
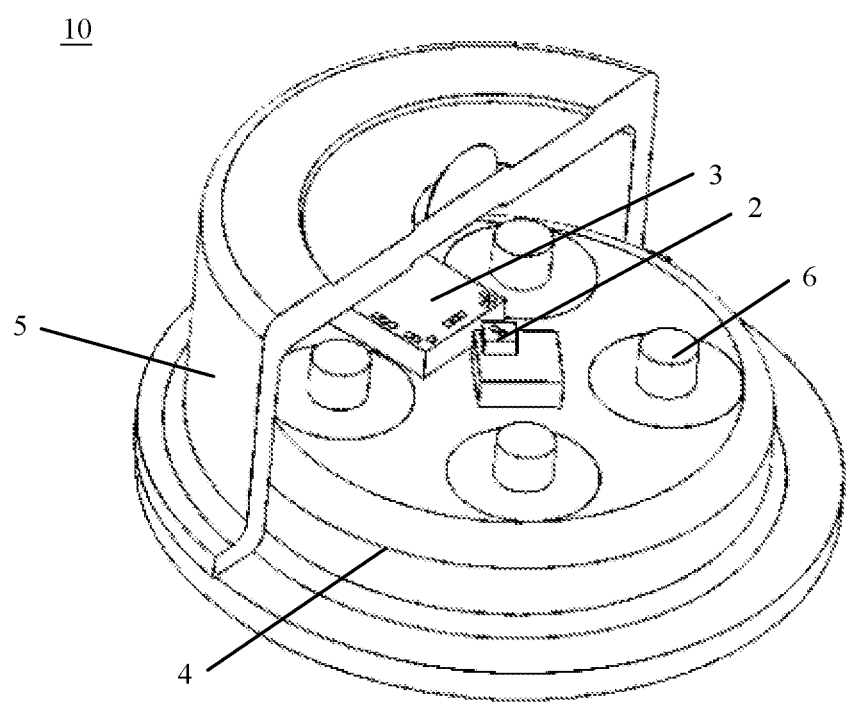
FIG. 2 is a schematic diagram of a structure of a receiver optical sub-assembly packaged in a transistor outline can (transistor outline can, TO CAN) form according to an embodiment of this application.

FIG. 2 is a schematic diagram of a structure of a receiver optical sub-assembly 10 packaged in a transistor outline can (transistor outline can, TO CAN) form according to an embodiment of this application. As shown in FIG. 2, the receiver optical sub-assembly includes a photodiode (photodiode, PD) 2, a trans-impedance amplifier (trans-impedance amplifier, TIA) 3, and commonly used electrical elements, such as a capacitor, a resistor, and an inductor, that drive the receiver optical sub-assembly to work normally. The receiver optical sub-assembly may further include functional elements such as a base 4 carrying the foregoing elements, a tube cap 5 configured to perform sealing and optical signal coupling, and a lens. The base 4 may also be referred to as a header (header). The base 4 is provided with several pins 6, and the pins 6 are respectively configured to: connect to a power supply, connect to a ground, and output an electrical signal obtained after optical-to-electrical conversion. The pins 6 on the base 4 may be connected to signal electrodes on the photodiode 2 and the trans-impedance amplifier 3 by using gold wires. In this way, a signal obtained after optical-to-electrical conversion can be output. Because light received by the photodiode is weak, an electrical signal generated by the photodiode 2 needs to be output to the trans-impedance amplifier 3 for amplification; and then, an amplified electrical signal is output through the pins 6.

Usually, the pins 6 and a bottom of the base 4 are electrically isolated, for example, may be isolated by using glass cement or another insulating material. The entire bottom may be used as a ground plane and is connected to an external ground through a special pin connected to the bottom. The external ground may be understood as the earth or a conductor connected to the earth. The elements on the base 4 may alternatively be connected through welding.

An example in which the receiver optical sub-assembly is disposed in an ONU is used. The ONU and a terminal device (such as a mobile phone or a router) usually perform transmission by using a wireless communication technology such as wireless fidelity (Wireless Fidelity, Wi-Fi). Therefore, the receiver optical sub-assembly is usually located in a complex electromagnetic radiation environment. Interference caused by electromagnetic radiation to a communication signal of the receiver optical sub-assembly is referred to as electromagnetic crosstalk, and an interference signal may also be referred to as a crosstalk signal. For example, especially in the 10G PON high-speed era, because a modulation frequency of a 10G PON signal and a 5G Wi-Fi carrier are on a same frequency band (both are 5 GHz), it is difficult to filter out, by using a conventional filtering means, electromagnetic crosstalk generated by a 5G Wi-Fi signal. In an example, an electrical signal generated in the receiver optical sub-assembly is in an order of 0.1 microamperes (μA) to 10 μA, while a transmit power of the 5G Wi-Fi signal is usually 500 milliwatts (mW), which is 5 million times greater than the signal of the receiver optical sub-assembly and interferes with the signal of the receiver optical sub-assembly very easily. An impact of electromagnetic crosstalk on the receiver optical sub-assembly is usually represented by a power cost defined by a difference between sensitivity without crosstalk and sensitivity with crosstalk. If an ordinary receiver optical sub-assembly does not have any anti-interference measures, an interference degree thereof may reach more than 10 dB. This seriously affects normal work of a system. Therefore, how to reduce the electromagnetic crosstalk to the receiver optical sub-assembly is a problem that urgently needs to be resolved in the industry.

In an Ethernet transmission system with a high speed (for example, a transmission rate greater than 10 G), a receiver optical sub-assembly is generally disposed on a device such as an optical switch or a router, and the receiver optical sub-assembly is also located in a complex electromagnetic radiation environment. For example, high-speed driving currents of a transmitter optical sub-assembly in an optical sub-assembly usually can reach at least 100 mA, and the high-speed alternating currents emit electromagnetic waves if encountering discontinuous impedance in a circuit, and therefore, generate weak electrical signals (in an order of about 0.1 microamperes (μA) to 10 μA) to the receiver optical sub-assembly and cause interference. Such interference is usually referred to as crosstalk between transmitting and receiving. Such crosstalk should be eliminated and avoided as much as possible when an optical sub-assembly and an optical module are designed. In addition, there are many switching chips with large power consumption and large capacities in a device such as an optical switch or a router. When these chips work, large electromagnetic radiation is generated. In addition, usually it is difficult to make impedance of a high-speed circuit completely continuous, and electromagnetic radiation is inevitably generated to the outside. All the electromagnetic radiation generates weak electrical signals to the receiver optical sub-assembly and causes interference. Therefore, how to reduce crosstalk caused by electromagnetic radiation in an optical network device to the receiver optical sub-assembly is always a major challenge in designing an optical sub-assembly. It is also affected by electromagnetic crosstalk from the outside.

For the foregoing problem, this application provides a solution of an anti-electromagnetic crosstalk receiver optical sub-assembly. An impact of electromagnetic crosstalk on sensitivity of a receiver optical sub-assembly is reduced by using a special anti-interference structure.

Figure 3:
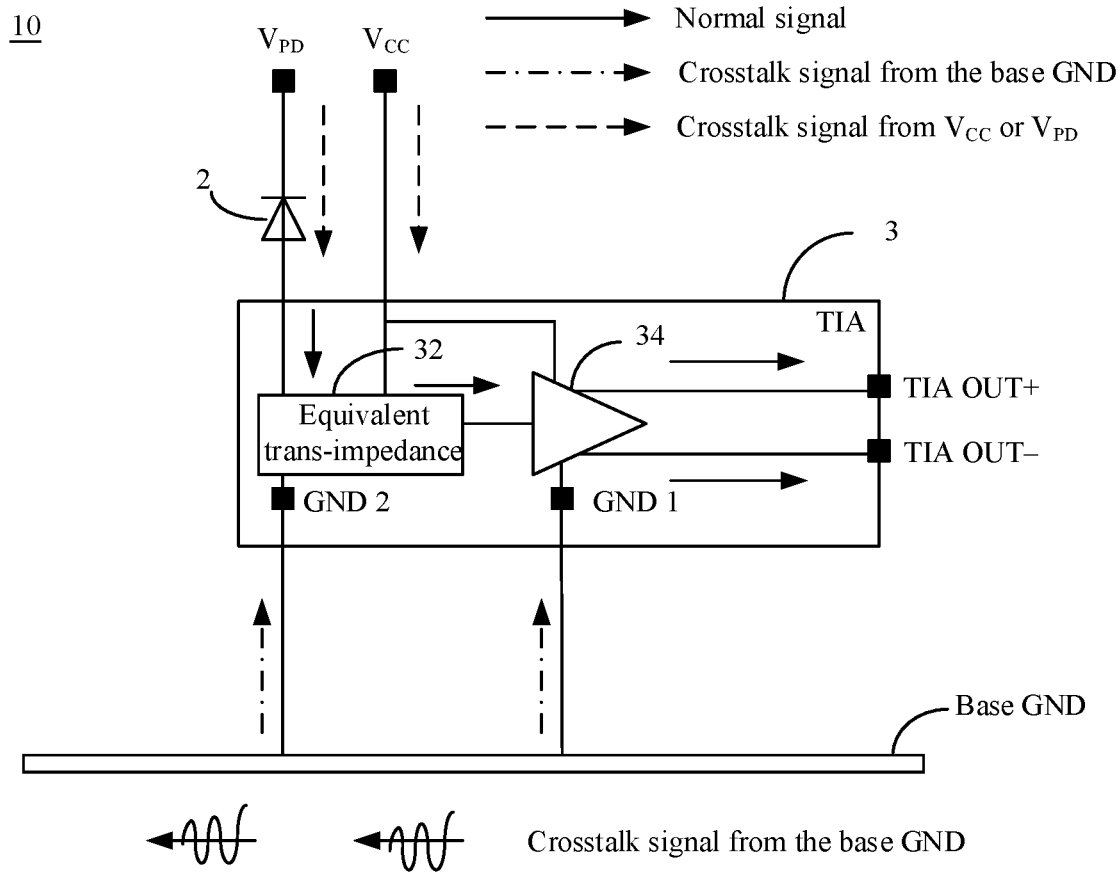
FIG. 3 is a schematic diagram of a circuit of a receiver optical sub-assembly according to an embodiment of this application.

FIG. 3 is a schematic diagram of a circuit of a receiver optical sub-assembly 10 according to an embodiment of this application. As shown in FIG. 3, the receiver optical sub-assembly 10 includes a photodiode (PD) 2, a trans-impedance amplifier (TIA) 3, and a base. A negative electrode of the photodiode 2 is connected to a power terminal $V_{PD}$. The power terminal $V_{PD}$ is configured to connect to a power supply $V_{PD}$. The power supply $V_{PD}$ is a driving power supply of the photodiode 2. A positive electrode of the photodiode 2 is connected to an input terminal of the trans-impedance amplifier 3. The photodiode 2 is configured to: perform optical-to-electrical conversion, and generate an electrical signal. Because a current output by the photodiode 2 is weak, the electrical signal output by the photodiode 2 is amplified by the trans-impedance amplifier 3. The trans-impedance amplifier 3 outputs the amplified electrical signal.

The structure of the trans-impedance amplifier 3 shown in FIG. 3 is an example of the trans-impedance amplifier 3. The trans-impedance amplifier 3 may include, for example, an equivalent trans-impedance 32 and an output buffer 34. An amplification factor of the trans-impedance amplifier 3 is usually represented by using the equivalent trans-impedance 32, and is numerically equal to a ratio of a voltage swing of a signal output by the trans-impedance amplifier 3 to an input weak electrical signal current. The output buffer 34 is an output stage of the trans-impedance amplifier 3, and is configured to output, in a manner, a signal amplified by the trans-impedance amplifier 3, for example, output the signal in a differential amplification manner or a simple singleterminal manner. The trans-impedance amplifier 3 may further include an input terminal, output terminals (TIA OUT+ and TIA OUT−), a power terminal $V_{CC}$, and ground terminals (a GND 1 and a GND 2). The input terminal of the trans-impedance amplifier 3 is configured to receive the electrical signal output by the photodiode 2, and the output terminals of the trans-impedance amplifier 3 are configured to output the amplified electrical signal. For example, the output terminals of the trans-impedance amplifier 3 may include differential signal output terminals TIA OUT+ and TIA OUT−. The power terminal $V_{CC}$ of the trans-impedance amplifier 3 is configured to connect to a power supply $V_{CC}$. The power supply $V_{CC}$ is a power supply of the trans-impedance amplifier 3. The ground terminal of the trans-impedance amplifier 3 may be grounded. As shown in FIG. 3, the ground terminal of the trans-impedance amplifier 3 may be connected to an external ground by connecting to the base ground (base GND). As described above, that the ground terminal is connected to the base may mean that the ground terminal is connected to a bottom of the base, and the bottom is connected to the external ground through a special pin.

FIG. 3 further shows loops of crosstalk signals and a normal signal. As shown in FIG. 3, electromagnetic crosstalk may include crosstalk signals of three types based on different sources of crosstalk signals entering the receiver optical sub-assembly 10. A first type is a crosstalk signal entering a signal loop through the power terminal $V_{PD}$ of the photodiode 2. A second type is a crosstalk signal entering a signal loop through the power terminal $V_{CC}$ of the trans-impedance amplifier 3. A third type is a crosstalk signal entering a signal loop through a ground (GND), which, for example, may be understood as a crosstalk signal entering the signal loop through a base ground (the base GND) or the ground terminal of the trans-impedance amplifier 3. The foregoing three types of crosstalk signals cause interference to a normal signal. Therefore, these crosstalk signals need to be filtered out as much as possible when a circuit is designed.

Figure 4:
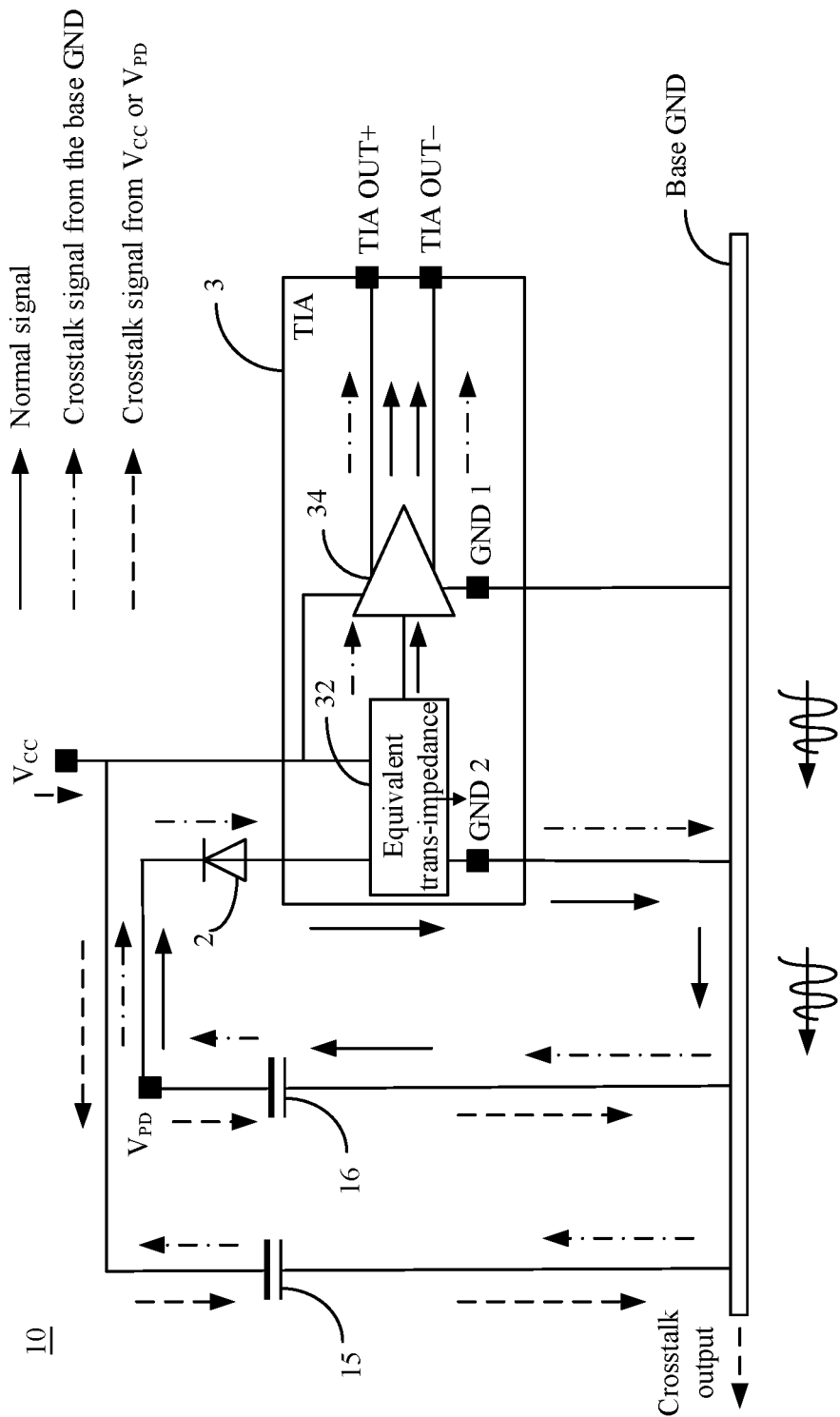
FIG. 4 is a schematic diagram of a signal loop of a receiver optical sub-assembly in the conventional technology.

In an example, FIG. 4 shows an anti-electromagnetic crosstalk solution. As shown in FIG. 4, a receiver optical sub-assembly 10 includes a fifth filter component 15 and a sixth filter component 16. A first terminal of the fifth filter component 15 is connected to a power terminal $V_{CC}$, and a second terminal of the fifth filter component 15 is connected to a base ground. The fifth filter component 15 may be configured to filter out a crosstalk signal from the power terminal $V_{CC}$. A first terminal of the sixth filter component 16 is connected to a power terminal $V_{PD}$, and a second terminal of the sixth filter component 16 is connected to the base. The sixth filter component 16 may be configured to filter out a crosstalk signal from the power terminal $V_{PD}$.

However, a circuit in FIG. 4 cannot process a crosstalk signal entering a signal loop through a base ground (base GND) or a ground terminal of a trans-impedance amplifier 3. For example, the crosstalk signal may enter a signal loop through a lower surface of the fifth filter component 15, may enter a signal loop through a lower surface of the sixth filter component 16, or may enter a signal loop through the base ground (base GND) and the ground terminal of the trans-impedance amplifier 3. The crosstalk signal is amplified by the trans-impedance amplifier 3, and is output together with a normal signal. This affects normal signal transmission Especially for a 10G PON system, a frequency of a signal for crosstalk of 5G Wi-Fi is consistent with a frequency of a normal signal of the system, and it is difficult to filter out the crosstalk signal in a subsequent circuit.

In a possible solution, an electromagnetic shielding cover may be added outside the receiver optical sub-assembly 10 to further reduce power costs and ensure normal work of the system. However, this increases costs. Moreover, because a size of a structure of the shielding cover is large, a size of the entire receiver optical sub-assembly 10 is increased, and it is difficult to meet a requirement in a compact scenario.

Figure 5:
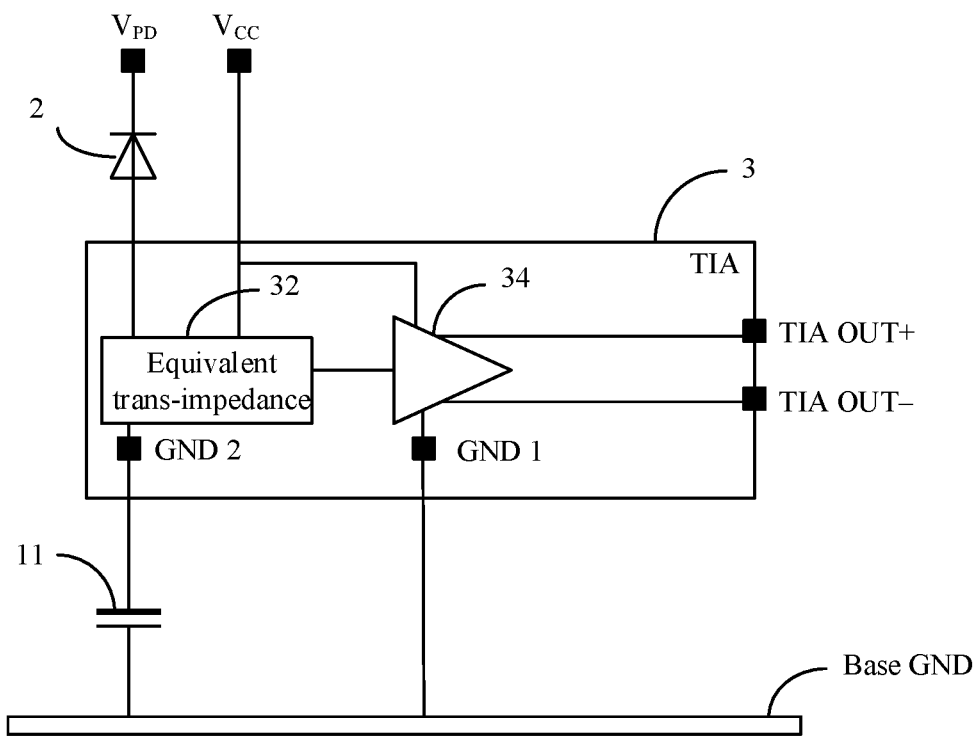
FIG. 5 is a schematic diagram of a circuit of a receiver optical sub-assembly according to another embodiment of this application.

To resolve the foregoing problem, this application further provides an anti-electromagnetic crosstalk solution to reduce crosstalk signals from a ground. FIG. 5 is a schematic diagram of a circuit of a receiver optical sub-assembly 10 according to another embodiment of this application.

As shown in FIG. 5, the receiver optical sub-assembly 10 includes a photodiode 2, a trans-impedance amplifier 3, and a first filter component 11. A connection relationship between the photodiode 2 and the trans-impedance amplifier 3 is the same as that in FIG. 3. For brevity, details are not described herein again. In FIG. 5, a first ground terminal (GND 1) of the trans-impedance amplifier 3 is configured to connect to an external ground, a second ground terminal (GND 2) of the trans-impedance amplifier 3 is connected to a first terminal of the first filter component 11, and a second terminal of the first filter component 11 is connected to the external ground. In other words, the first filter component 11 is disposed between the external ground and the second ground terminal (GND 2) of the trans-impedance amplifier 3. A crosstalk signal from a ground can be effectively filtered out by using such a structure.

In this embodiment of this application, the first ground terminal (GND 1) of the trans-impedance amplifier 3 is connected to the external ground to implement direct current grounding. In addition, the first filter component 11 is disposed between the second ground terminal (GND 2) of the trans-impedance amplifier 3 and the external ground to implement alternating current grounding. The first filter component 11 can filter out an electromagnetic crosstalk signal from a ground, thereby improving anti-electromagnetic interference performance of the receiver optical sub-assembly 10.

It should be noted that the trans-impedance amplifier 3 includes one or more ground terminals. A trans-impedance amplifier 3 including only one ground terminal may also achieve an effect of a plurality of ground terminals in an expansion manner (for example, a manner of welding a plurality of wires on one ground point to the ground). The plurality of ground terminals of the trans-impedance amplifier 3 may be divided into a plurality of first ground terminals (GNDs 1) and a plurality of second ground terminals (GNDs 2). For example, the trans-impedance amplifier may include one or more input stage ground terminals and one or more output stage ground terminals, and may further include one or more middle stage ground terminals. The one or more middle stage ground terminals may be one or more ground terminals functionally located between an input stage and an output stage. Due to performance and internal layout requirements of a trans-impedance amplifier chip, the different ground terminals are usually respectively located at different physical locations on the trans-impedance amplifier 3. There are circuit parameters, such as an inductance, a capacitance, and a resistance, between the different ground terminals. Therefore, the ground terminals cannot be collectively described as one. In this application, the first ground terminal and the second ground terminal represent different ground terminals at any two or two groups of physical locations on the trans-impedance amplifier 3, and the trans-impedance amplifier may include one or more first ground terminals and one or more second ground terminals.

Figure 6:
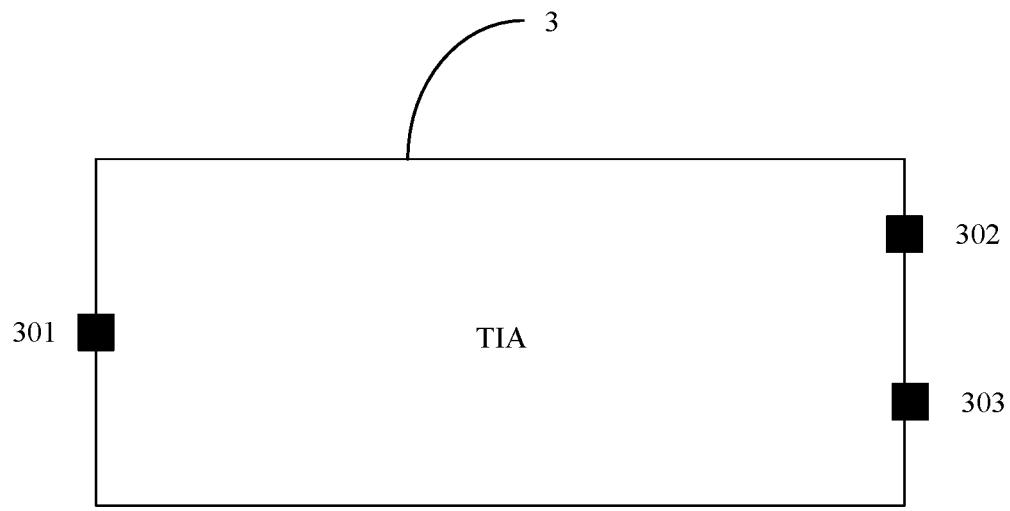
FIG. 6 is a schematic diagram of a trans-impedance amplifier according to an embodiment of this application.

For example, a trans-impedance amplifier shown in FIG. 6 includes one input ground terminal 301 and two output stage ground terminals 302 and 303. Solutions of dividing the ground terminals into a first ground terminal and a second ground terminal are as follows:

(1) 301 is a first ground terminal, and 302 and 303 are combined into a second ground terminal.

(2) 301 and 302 are combined into a first ground terminal, and 303 is a second ground terminal.

(3) 301 is a first ground terminal, 302 is a first ground terminal, and 303 is a second ground terminal. In this solution, 301 and 302 are used as independent first ground terminals, that is, 301 and 302 both are first ground terminals.

(4) 301 is a first ground terminal, 302 is a second ground terminal, and 303 is a second ground terminal. In this solution, 302 and 303 are used as independent second ground terminals, that is, 302 and 303 both are second ground terminals described in this application.

(5) 301 is a second ground terminal, and 302 and 303 are combined into a first ground terminal.

(6) 301 and 302 are combined into a second ground terminal, and 303 is a first ground terminal.

(7) 301 is a second ground terminal, 302 is a second ground terminal, and 303 is a first ground terminal. In this solution, 301 and 302 are used as independent second ground terminals, that is, 301 and 302 both are second ground terminals.

(8) 301 is a second ground terminal, 302 is a first ground terminal, and 303 is a first ground terminal. In this solution, 302 and 303 are used as independent first ground terminals, that is, 302 and 303 both are first ground terminals described in this application.

As can be learned, the trans-impedance amplifier 3 has a plurality of division manners for the first ground terminal (GND 1) and a plurality of division manners for the second ground terminal (GND 2). One or more first ground terminals (GNDs 1) of the trans-impedance amplifier 3 are separately configured to connect to a direct current ground (the external ground). One or more second ground terminals (GNDs 2) of the trans-impedance amplifier 3 are separately configured to connect to an alternating current ground (separately connected to the ground through a filter component (for example, a first filter component 11)). It should be noted that the first filter component 11 may include a plurality of independent filters, and each filter is connected to a second ground terminal (GND 2).

Figure 7:
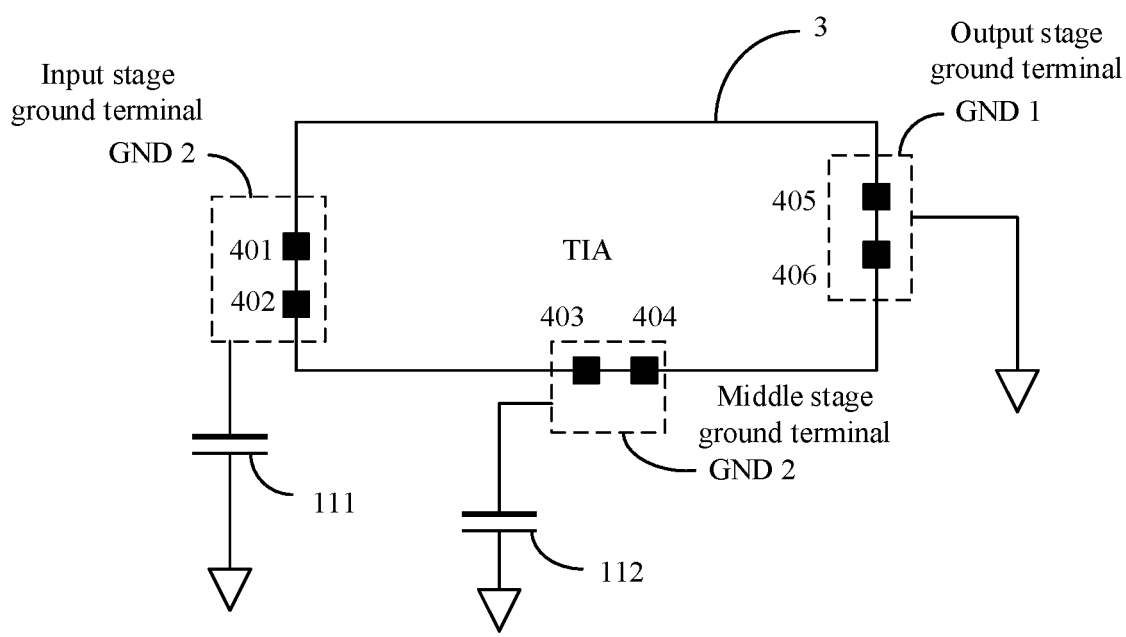
FIG. 7 is a schematic diagram of a trans-impedance amplifier according to another embodiment of this application.

Further, FIG. 7 is an example of a division solution for a first ground terminal (GND 1) and a second ground terminal (GND 2) of a trans-impedance amplifier 3 in this application. Input stage ground terminals 401 and 402 that have a same function are combined into a second ground terminal (GND 2), middle stage ground terminals 403 and 404 that have a same function are combined into a second ground terminal (GND 2), and output stage ground terminals 405 and 406 that have a same function are combined into a first ground terminal (GND 1). The second ground terminal (GND 2) is connected to a first filter component 111. The second ground terminal (GND 2) is connected to another first filter component 112. The ground terminals 401 and 402 have a same function in the trans-impedance amplifier 3, are physically close to each other, and are connected to the first filter component 111 together. In this way, electromagnetic interference noise of the ground terminals 401 and 402 can be filtered out while use of the first filter component and costs are reduced. Therefore, the ground terminals 401 and 402 have optimized anti-electromagnetic interference performance. Similarly, the ground terminals 403 and 404 have a same function in the trans-impedance amplifier 3, are physically close to each other, are connected to the first filter component 112 together, and also have optimized anti-electromagnetic interference performance. As shown in FIG. 7, the input stage ground terminal and the middle stage ground terminal of the trans-impedance amplifier 3 are both used as second ground terminals (GND 2) to connect to the first filter components (111 and 112). In this way, electromagnetic interference noise of the input stage ground terminal and the middle stage ground terminal can be filtered out, thereby improving the anti-electromagnetic interference performance. It should be noted that if the output stage ground terminal of the trans-impedance amplifier 3 is used as a second ground terminal (GND 2) to connect to the first filter component 111, electromagnetic interference noise of the output stage ground terminal can also be filtered out, thereby improving the anti-electromagnetic interference performance. Therefore, it may be understood as that the first ground terminal (GND 1) of the trans-impedance amplifier 3 is configured to connect to a direct current ground (an external ground), and the second ground terminal (GND 2) of the trans-impedance amplifier 3 is configured to connect to an alternating current ground (is connected to the ground through the filter component). Provided that it is ensured that the direct current ground of the trans-impedance amplifier 3 can meet a performance requirement, all other ground terminals of the trans-impedance amplifier 3 may be connected to the first filter components (11, 111, and 112) to filter out electromagnetic interference noise of corresponding ground terminals, thereby improving the anti-electromagnetic interference performance. Further, the input stage ground terminal of the trans-impedance amplifier 3 is used as the second ground terminal (GND 2), so that an electromagnetic crosstalk signal from a ground (a base ground or the ground terminal of the trans-impedance amplifier 3) may be filtered out at an input stage of the trans-impedance amplifier 3, that is, before a trans-impedance amplification function. In this way, a stronger impact of electromagnetic crosstalk caused by a crosstalk signal amplified by the trans-impedance amplifier can be avoided, and the anti-electromagnetic interference performance is optimized.

Optionally, the receiver optical sub-assembly 10 includes a base, and the base may be connected to the external ground. A related element inside the receiver optical sub-assembly 10 may be connected to the external ground through the base. For example, the first ground terminal (GND 1) of the trans-impedance amplifier 3 is connected to the external ground through the base of the receiver optical sub-assembly 10, and the second terminal of the first filter component 11 is connected to the external ground through the base of the receiver optical sub-assembly 10. Alternatively, a related element inside the receiver optical sub-assembly 10 may be directly connected to the external ground.

Optionally, the first filter component 11 may be a filter component with a large capacitance. In an example, the capacitance of the first filter component 11 may be 100 picofarads (pF) or may be greater than 100 pF. The external ground connected to the base may be a ground of a board. Parasitic parameters of crosstalk signals gathered on the base ground (base GND) or the ground terminal of the trans-impedance amplifier 3 are small, and a leakage is quick. The crosstalk signals are gathered within a short period of time and have a pulse-type characteristic. A crosstalk signal from the base ground (base GND) or the ground terminal of the trans-impedance amplifier 3 can be absorbed and isolated by using the large capacitance of the first filter component 11, so that electromagnetic crosstalk from the ground can be filtered out.

Optionally, a greater scattering parameter of the first filter component 11 may be set on the crosstalk signal frequency band, so that the first filter component 11 has a stronger filtering function on a crosstalk signal. For example, the scattering parameter of the first filter component 11 may be set to greater than 20 dB on the crosstalk signal frequency band.

Optionally, on the basis of FIG. 5, the receiver optical sub-assembly 10 in the embodiments of this application further has various variations, and all the variations fall within the protection scope of the embodiments of this application. For example, in some variations, the receiver optical sub-assembly 10 can further filter out a crosstalk signal from the power terminal $V_{PD}$ or a crosstalk signal from the power terminal $V_{CC}$, or can implement another function. The following continues to describe the receiver optical sub-assembly 10 in the embodiments of this application with reference to the accompanying drawings.

Figure 8:
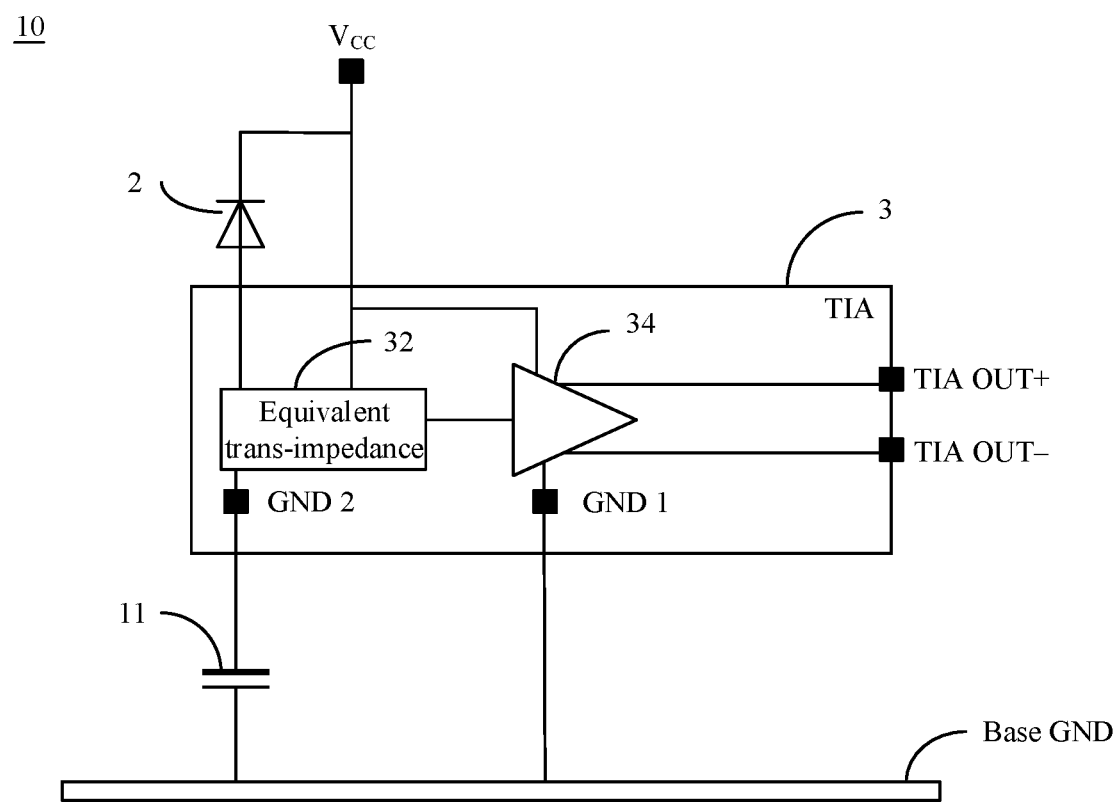
FIG. 8 is a schematic diagram of a circuit of a receiver optical sub-assembly according to another embodiment of this application.

Optionally, in various embodiments of this application, the power supply $V_{CC}$ of the trans-impedance amplifier 3 and the power supply $V_{PD}$ of the photodiode 2 may be a same outside power supply or may be different outside power supplies. For example, as shown in FIG. 8, the power terminal $V_{CC}$ of the trans-impedance amplifier 3 and the negative electrode of the photodiode 2 may be connected to a same outside power supply $V_{CC}$. In this case, the receiver optical sub-assembly 10 may be connected to one outside power supply, and the outside power supply supplies power to both the trans-impedance amplifier 3 and the photodiode 2.

Figure 9:
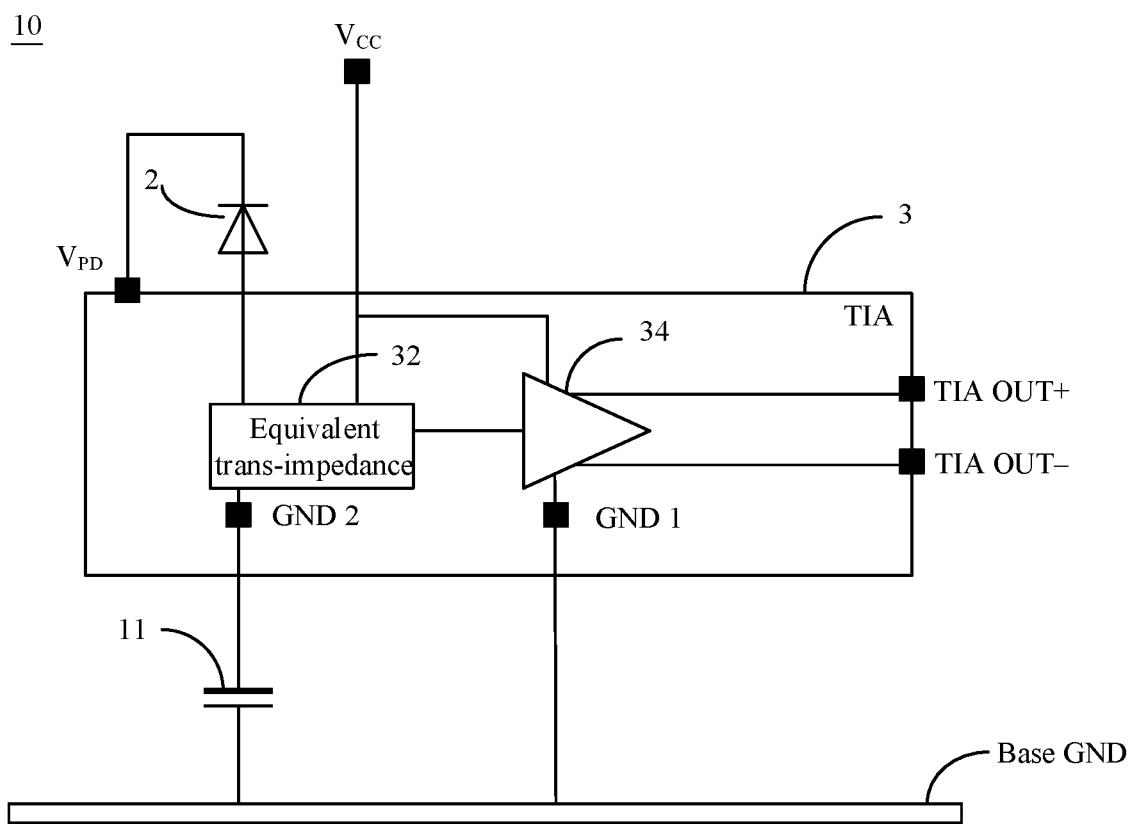
FIG. 9 is a schematic diagram of a circuit of a receiver optical sub-assembly according to another embodiment of this application.

Alternatively, in various embodiments of this application, as shown in FIG. 9, the power terminal $V_{CC}$ of the trans-impedance amplifier 3 may be connected to an outside power supply $V_{CC}$. The trans-impedance amplifier 3 may include a voltage regulation module (not shown in the figure). The voltage regulation module is connected to the power terminal $V_{CC}$ of the trans-impedance amplifier 3. The negative electrode of the photodiode 2 is connected to the voltage regulation module. The voltage regulation module may convert an input voltage and generate an output voltage obtained after the conversion. The voltage regulation module is equivalent to the power supply $V_{PD}$ of the photodiode. In this case, the power supply of the trans-impedance amplifier 3 is an outside power supply, and the photodiode is powered by using the voltage regulation module disposed in the trans-impedance amplifier 3. Optionally, the voltage regulation module may also be referred to as a built-in power module, a voltage regulator, a voltage converter, or the like.

Figure 10A:
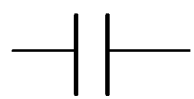
FIG. 10A, FIG. 10B, FIG. 10C, FIG. 10D and FIG. 10E are possible schematic diagrams of a filter component according to an embodiment of this application.
Figure 10B:
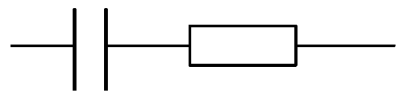
Figure 10C:
Figure 10D:
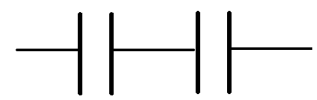
Figure 10E:
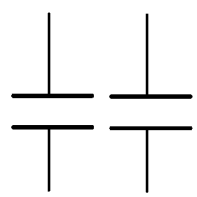

Optionally, the filter components in various embodiments of this application, for example, the first filter component 11 and a second filter component 12 to a sixth filter component 16 that are described below may be components that can implement a filtering function for a specific electromagnetic crosstalk frequency band. The filter components may include active filter components and/or passive filter components. FIG. 10A, FIG. 10B, FIG. 10C, FIG. 10D and FIG. 10E are possible schematic diagrams of a filter component according to an embodiment of this application. As shown in FIG. 10A, the filter component may include a capacitor. As shown in FIG. 10B, the filter component may include a capacitor and a resistor, or may further include another integrated component. As shown in FIG. 10C, the filter component may include a capacitor and an inductor, or may further include another integrated component. As shown in FIG. 10D, the filter component may include a plurality of capacitors connected in series. As shown in FIG. 10E, the filter component may include a plurality of capacitors connected in parallel. The capacitor or the inductor in FIG. 10A, FIG. 10B, FIG. 10C, FIG. 10D or FIG. 10E may be a structure formed through wire seating. It may be understood that the filter components in various embodiments of this application are not limited to the components in the foregoing examples, and may be in other forms. Any components that can implement a filtering function on a specific electromagnetic crosstalk frequency band may be understood as the filter components in the various embodiments of this application.

Figure 11:
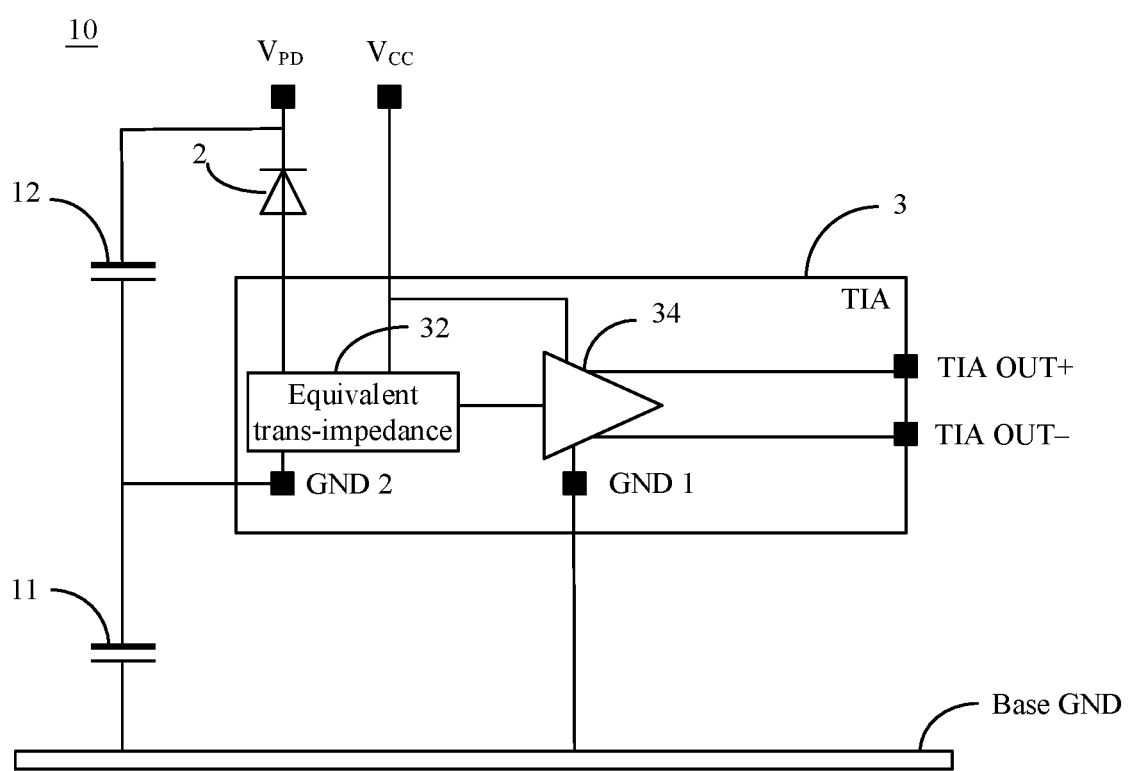
FIG. 11 is a schematic diagram of a circuit of a receiver optical sub-assembly according to another embodiment of this application.

FIG. 11 is a schematic diagram of a circuit of a receiver optical sub-assembly 10 according to another embodiment of this application. As shown in FIG. 11, in addition to a first filter component 11, the receiver optical sub-assembly 10 may further include a second filter component 12. A first terminal of the second filter component 12 is connected to a negative electrode of a photodiode 2, and a second terminal of the second filter component 12 is connected to a first terminal of the first filter component 11. In other words, the second filter component 12 is disposed between the negative electrode of the photodiode 2 and the first filter component 11. Because the negative electrode of the photodiode 2 is configured to connect to a power terminal $V_{PD}$, it may also be considered that the second filter component 12 is disposed between the power terminal $V_{PD}$ and the first filter component 11. The second filter component 12 and the first filter component 11 can filter out a crosstalk signal from the power terminal $V_{PD}$ of the photodiode 2.

In addition, the second filter component 12, the photodiode 2, and a trans-impedance amplifier 3 may further form an independent signal loop, so that a loop of a high frequency signal does not pass through a base. Electromagnetic crosstalk from a power supply is suppressed, and electromagnetic crosstalk from a base ground (base GND) or a ground terminal of the trans-impedance amplifier 3 is also isolated and absorbed, thereby implementing full path isolation of an entire trans-impedance amplification loop of the receiver optical sub-assembly 10 from the electromagnetic crosstalk, and improving anti-electromagnetic crosstalk performance.

In an example, a scattering parameter of the second filter component 12 on a crosstalk signal frequency band may be set as greater as possible, so that the second filter component 12 has a stronger filtering function on a crosstalk signal. For example, the scattering parameter of the second filter component 12 may be greater than 20 dB on the crosstalk signal frequency band.

Figure 12:
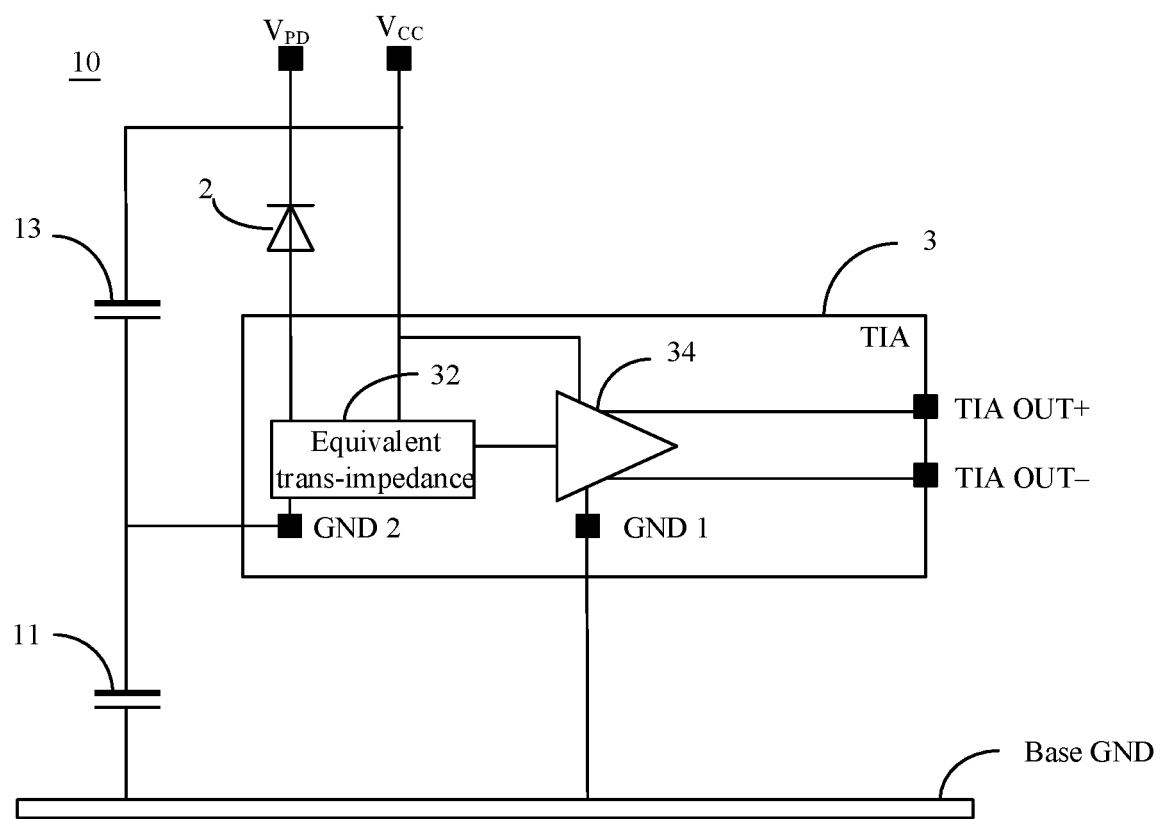
FIG. 12 is a schematic diagram of a circuit of a receiver optical sub-assembly according to another embodiment of this application.

FIG. 12 is a schematic diagram of a circuit of a receiver optical sub-assembly 10 according to another embodiment of this application. As shown in FIG. 12, the receiver optical sub-assembly 10 includes a first filter component 11 and a third filter component 13. A first terminal of the third filter component 13 is connected to a power terminal $V_{CC}$ of a trans-impedance amplifier 3, and a second terminal of the third filter component 13 is connected to a second ground terminal (GND 2) of the trans-impedance amplifier 3. In other words, the third filter component 13 is disposed between the power terminal $V_{CC}$ of the trans-impedance amplifier 3 and the second ground terminal (GND 2) of the trans-impedance amplifier 3. Because the power terminal $V_{CC}$ of the trans-impedance amplifier 3 is configured to connect to a power supply $V_{CC}$ and the second ground terminal (GND 2) of the trans-impedance amplifier 3 is connected to a first terminal of the first filter component 11, it may also be considered that the third filter component 13 is disposed between the power supply $V_{CC}$ and the first filter component 11. The first filter component 11 and the third filter component 13 can filter out a crosstalk signal from the power terminal VCC.

In addition, the third filter component 13 and the trans-impedance amplifier 3 may further form an independent signal loop, so that a loop of a high frequency signal does not pass through a base. Electromagnetic crosstalk from a power supply is suppressed, and electromagnetic crosstalk from a base ground (base GND) or a ground terminal of the trans-impedance amplifier 3 is also isolated and absorbed, thereby improving anti-electromagnetic crosstalk performance.

Optionally, the third filter component 13 may be a filter component with a large capacitance. In an example, the capacitance of the third filter component 13 may be 100 picofarads (pF) or may be greater than 100 pF. A component with a large capacitance is used as the third filter component 13, so that electromagnetic crosstalk from the ground can be filtered out more quickly.

Optionally, a greater scattering parameter of the third filter component 13 may be set on a crosstalk signal frequency band, so that the third filter component 13 has a stronger filtering function on a crosstalk signal. For example, the scattering parameter of the third filter component 13 may be set to greater than 20 dB on the crosstalk signal frequency band.

Figure 13:
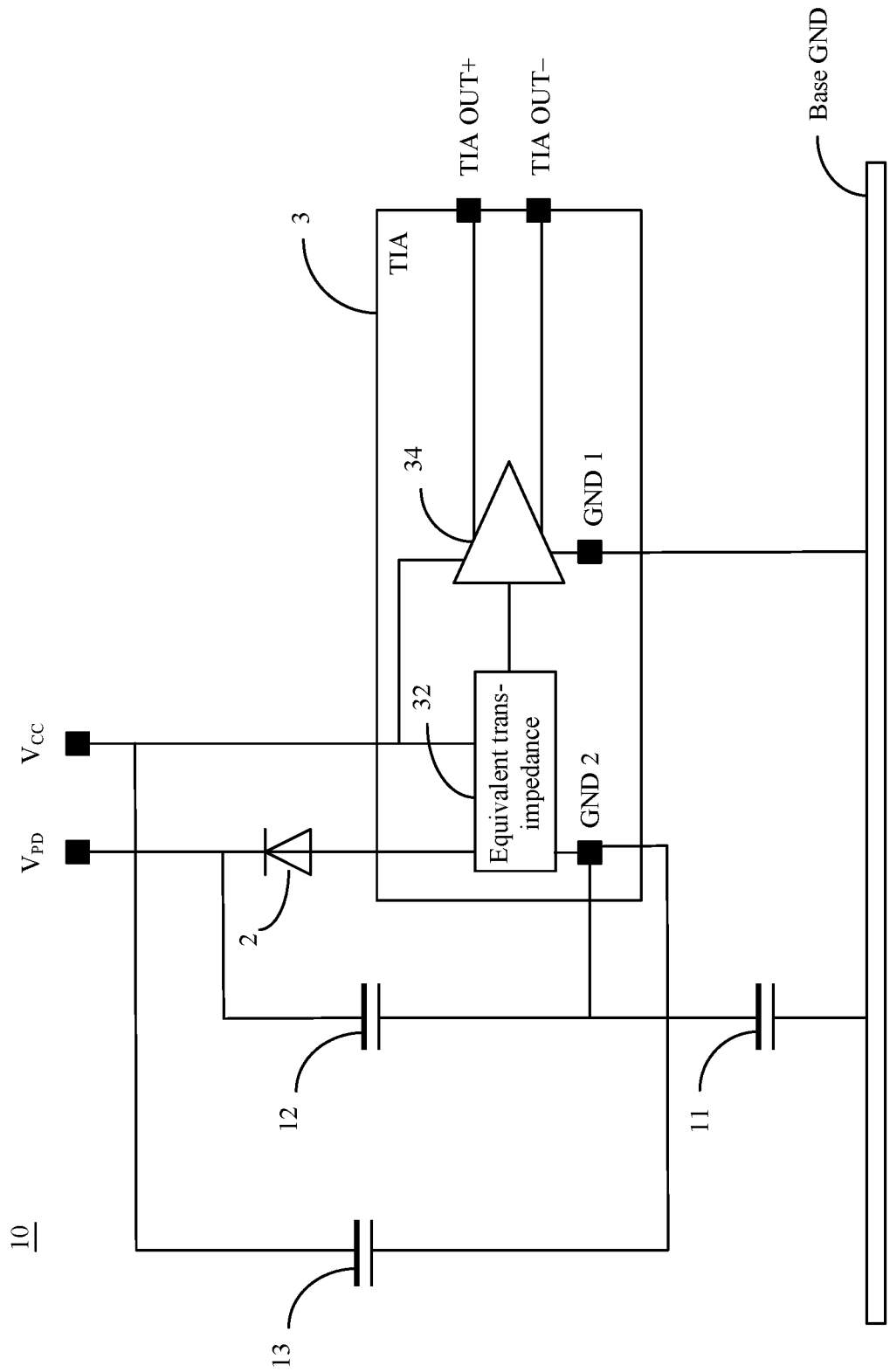
FIG. 13 is a schematic diagram of a circuit of a receiver optical sub-assembly according to another embodiment of this application.

Optionally, as shown in FIG. 13, the receiver optical sub-assembly 10 in FIG. 12 may further include a second filter component 12. A connection relationship and a function of the second filter component 12 are the same as those described above, and details are not described herein again.

Figure 14:
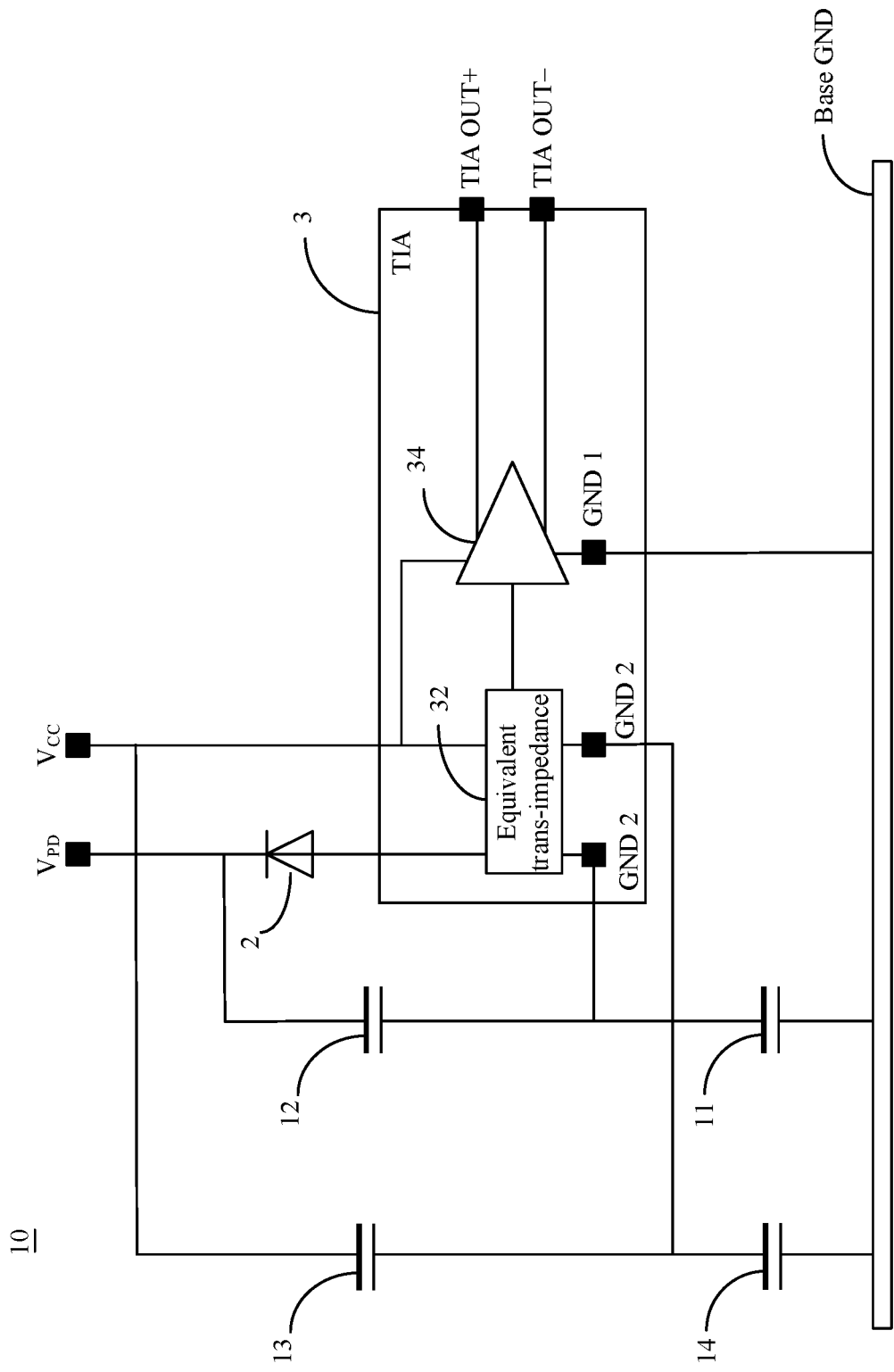
FIG. 14 is a schematic diagram of a circuit of a receiver optical sub-assembly according to another embodiment of this application.

FIG. 14 is a schematic diagram of a circuit of a receiver optical sub-assembly 10 according to another embodiment of this application. As shown in FIG. 14, the receiver optical sub-assembly 10 includes a first filter component 11, a second filter component 12, a third filter component 13, and a fourth filter component 14. A first terminal of the fourth filter component 14 is connected to a second terminal of the third filter component 13. A second terminal of the fourth filter component 14 is connected to an external ground. In other words, the fourth filter component 14 is disposed between the third filter component 13 and the external ground. The fourth filter component 14 may be configured to filter out electromagnetic crosstalk from a ground. In this embodiment of this application, functions of the first filter component 11 to the third filter component 13 are the same as or similar to those described above, and details are not described herein again.

Optionally, because the second terminal of the third filter component 13 is connected to a second ground terminal (GND 2) of a trans-impedance amplifier 3, connection relationships of two terminals of the fourth filter component 14 may be the same as those of the first filter component 11. Specifically, because the second ground terminal (GND 2) of the trans-impedance amplifier 3 may include one or more ground terminals, the first filter component 11 and the fourth filter component 14 may be connected to a same ground terminal of the trans-impedance amplifier 3, or may be connected to different ground terminals of the trans-impedance amplifier 3. When second ground terminals (GNDs 2) connected to the first filter component 11 and the fourth filter component 14 are different ground terminals of the trans-impedance amplifier 3, the first filter component 11 and the fourth filter component 14 may be implemented by using different filter components. When second ground terminals (GNDs 2) connected to the first filter component 11 and the fourth filter component 14 are a same ground terminal of the trans-impedance amplifier 3, the first filter component 11 and the fourth filter component 14 may be a same filter component (for example, as shown in FIG. 13). For example, the first filter component 11 and the fourth filter component 14 may be implemented by using a same capacitor, or may be implemented by using a plurality of capacitors. For example, if a capacitance of the first filter component 11 is 100 pF and a capacitance of the fourth filter component 14 is 100 pF, a 200-pF capacitor may be disposed between the second ground terminal (GND 2) of the trans-impedance amplifier 3 and the external ground, or two 100-pF capacitors may be connected in parallel between the second ground terminal (GND 2) of the trans-impedance amplifier 3 and the external ground, or another manner may be used for implementation.

In this embodiment of this application, the first filter component 11 and the second filter component 12 can filter out a crosstalk signal from a power terminal $V_{PD}$ of a photodiode 2. The third filter component 13 and the fourth filter component 14 can filter out a crosstalk signal from a power terminal $V_{CC}$. In addition, the second filter component 12, the photodiode 2, and the trans-impedance amplifier 3 may form an independent signal loop. The third filter component 13 and the trans-impedance amplifier 3 may also form an independent signal loop. The two independent signal loops enable a loop of a high frequency signal not to pass through a base. Electromagnetic crosstalk from a power supply is suppressed, and electromagnetic crosstalk from a base ground (base GND) or a ground terminal of the trans-impedance amplifier 3 is also isolated and absorbed, thereby improving anti-electromagnetic crosstalk performance.

Figure 15:
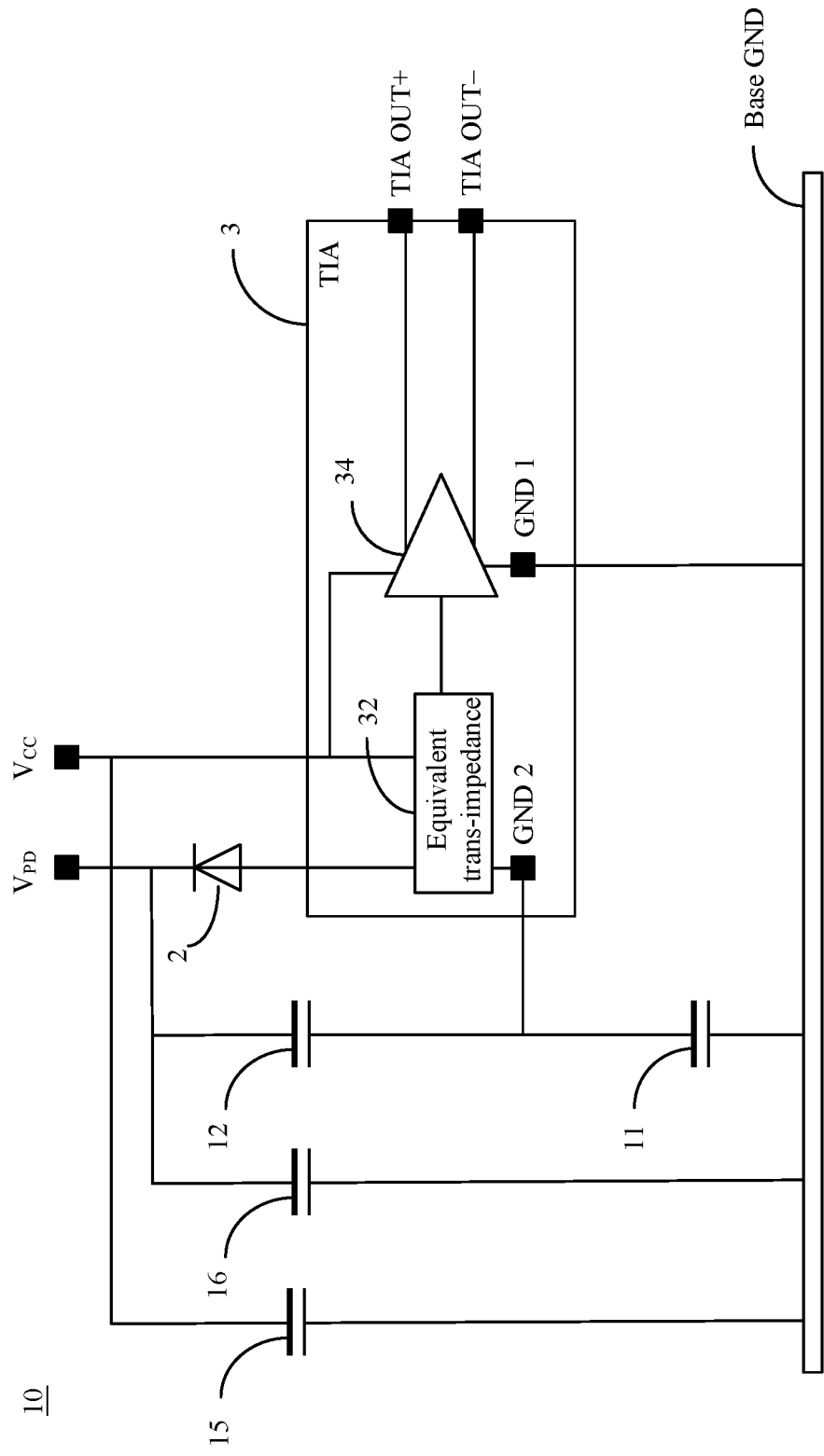
FIG. 15 is a schematic diagram of a circuit of a receiver optical sub-assembly according to another embodiment of this application.

FIG. 15 is a schematic diagram of a circuit of a receiver optical sub-assembly 10 according to another embodiment of this application. As shown in FIG. 15, the receiver optical sub-assembly 10 includes a first filter component 11, a second filter component 12, and a fifth filter component 15. A first terminal of the fifth filter component 15 is connected to a power terminal $V_{CC}$ of a trans-impedance amplifier 3, and a second terminal of the fifth filter component 15 is connected to an external ground. In other words, the fifth filter component 15 is disposed between the power terminal $V_{CC}$ of the trans-impedance amplifier 3 and the external ground. The fifth filter component 15 may be configured to suppress a crosstalk signal from the power terminal $V_{CC}$.

Optionally, as shown in FIG. 15, the receiver optical sub-assembly 10 further includes a sixth filter component 16. A first terminal of the sixth filter component 16 is connected to a negative electrode of a photodiode 2, and a second terminal of the sixth filter component 16 is connected to the external ground. In other words, the sixth filter component 16 is disposed between the negative electrode of the photodiode 2 and the external ground. Because the negative electrode of the photodiode 2 is connected to a power terminal $V_{PD}$, it may be considered that the sixth filter component 16 is disposed between the power terminal $V_{PD}$ of the photodiode 2 and the external ground. The sixth filter component 16 may be configured to filter out a crosstalk signal from the power terminal $V_{PD}$ of the photodiode 2.

Optionally, any receiver optical sub-assembly 10 shown in FIG. 5 to FIG. 14 may include the fifth filter component 15 and/or the sixth filter component 16.

Figure 16A:
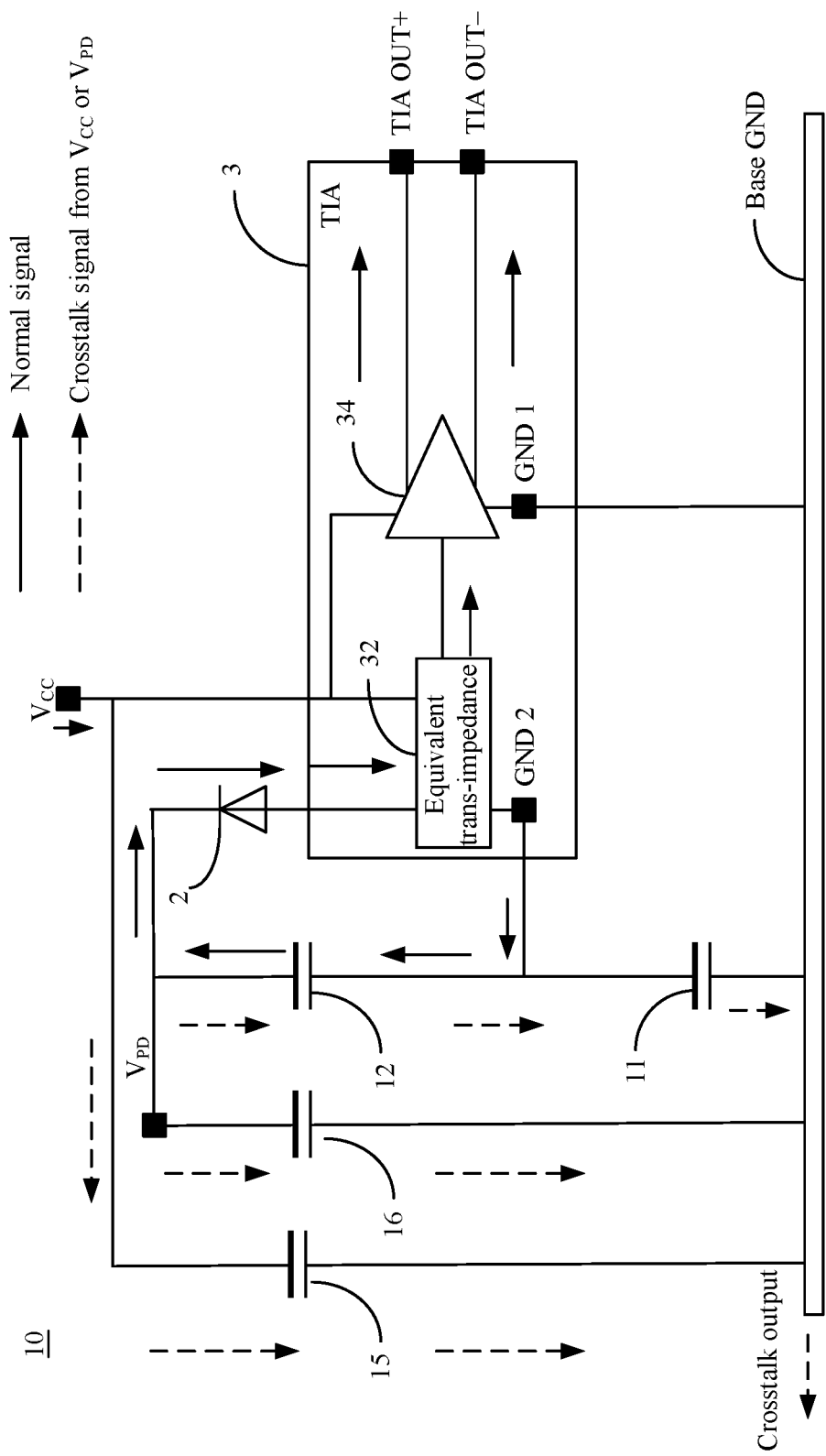
FIG. 16A and FIG. 16B are a schematic diagram of signal loops of the receiver optical sub-assembly in FIG. 15.
Figure 16B:
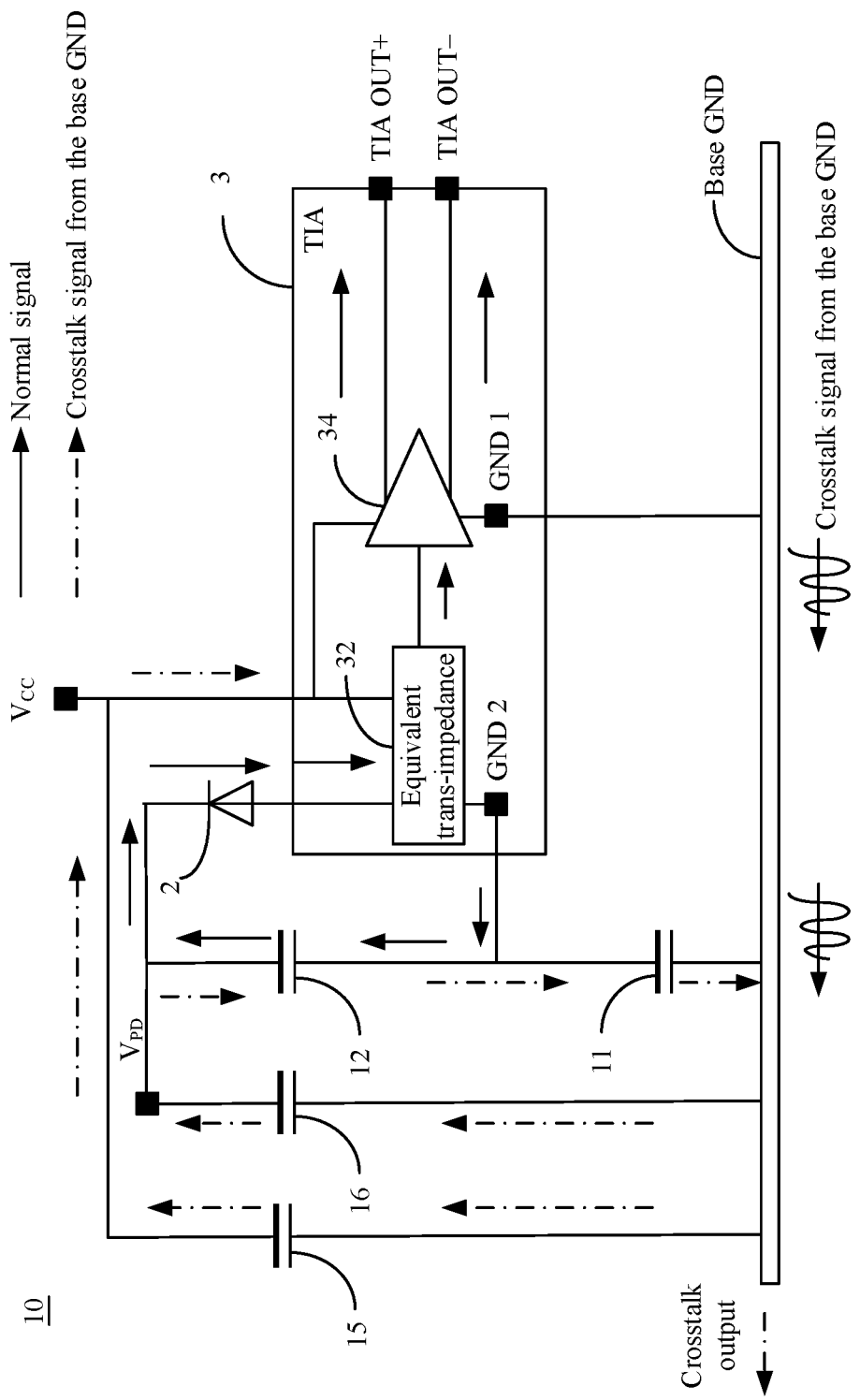

FIG. 16A and FIG. 16B are a schematic diagram of signal loops of the receiver optical sub-assembly 10 in FIG. 15. FIG. 16A shows a crosstalk signal from a power terminal $V_{CC}$ or a power terminal $V_{PD}$. FIG. 16B shows a crosstalk signal from a base ground (base GND). As shown in FIG. 16A and FIG. 16B, the crosstalk signal from the power terminal $V_{CC}$ may be filtered out by the fifth filter component 15; and the crosstalk signal from the power terminal $V_{PD}$ may be filtered out by the sixth filter component 16. Alternatively, the crosstalk signal from the power terminal $V_{PD}$ may be filtered out by the first filter component 11 and the second filter component 12. The second filter component 12, the photodiode 2, and the trans-impedance amplifier 3 form an independent signal loop. Because the first filter component 11 has isolated a crosstalk signal from a ground and the crosstalk signal does not enter the foregoing signal loop, electromagnetic interference from the ground is well suppressed.

Most crosstalk signals from the ground can be filtered out by the first filter component 11. A small part of crosstalk signals from the ground can be filtered out by the fifth filter component 15. Because a $V_{CC}$ power line inside the trans-impedance amplifier 3 has a good filtering effect on high frequency crosstalk, the $V_{CC}$ power line inside the trans-impedance amplifier 3 can filter out this part of crosstalk signals after this part of crosstalk signals enter the trans-impedance amplifier 3. A small part of crosstalk signals from the ground enter a $V_{PD}$ power loop through the sixth filter component 16, and this part of crosstalk signals may be filtered out by the first filter component 11 and the second filter component 12.

The receiver optical sub-assembly 10 shown in FIG. 15, FIG. 16A, and FIG. 16B has a good filtering capability for crosstalk signals from the power terminal $V_{PD}$, the power terminal $V_{CC}$, and the ground, thereby improving an anti-electromagnetic interference capability of the receiver optical sub-assembly 10.

Figure 17:
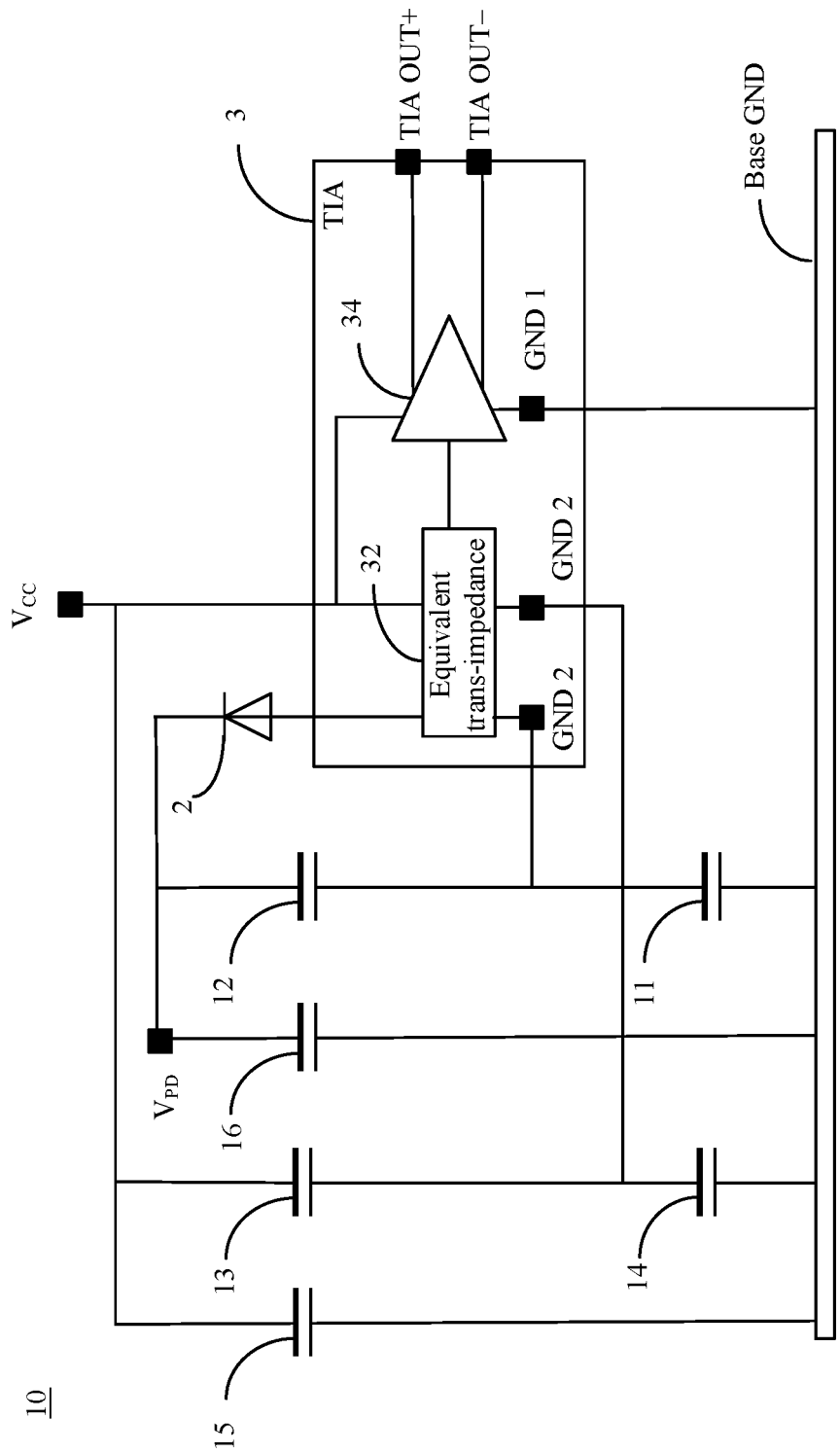
FIG. 17 is a schematic diagram of a circuit of a receiver optical sub-assembly according to another embodiment of this application.

FIG. 17 is a schematic diagram of a circuit of a receiver optical sub-assembly 10 according to another embodiment of this application. The receiver optical sub-assembly 10 in FIG. 17 includes a first filter component 11 to a sixth filter component 16. A connection manner of the various filter components in FIG. 17 is the same as that in the foregoing embodiment. For brevity, details are not described herein again.

Figure 18A:
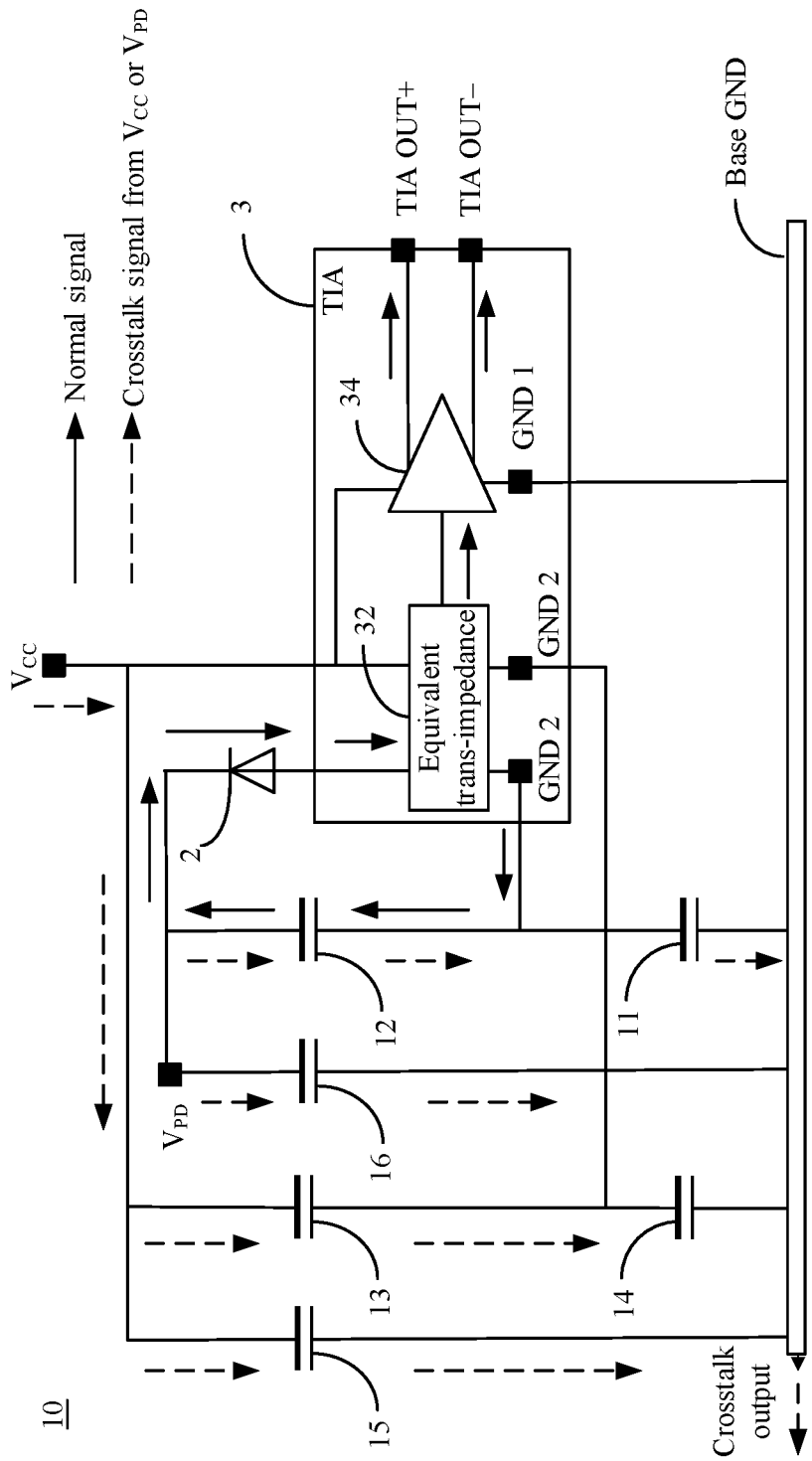
FIG. 18A and FIG. 18B are a schematic diagram of signal loops of the receiver optical sub-assembly in FIG. 17.
Figure 18B:
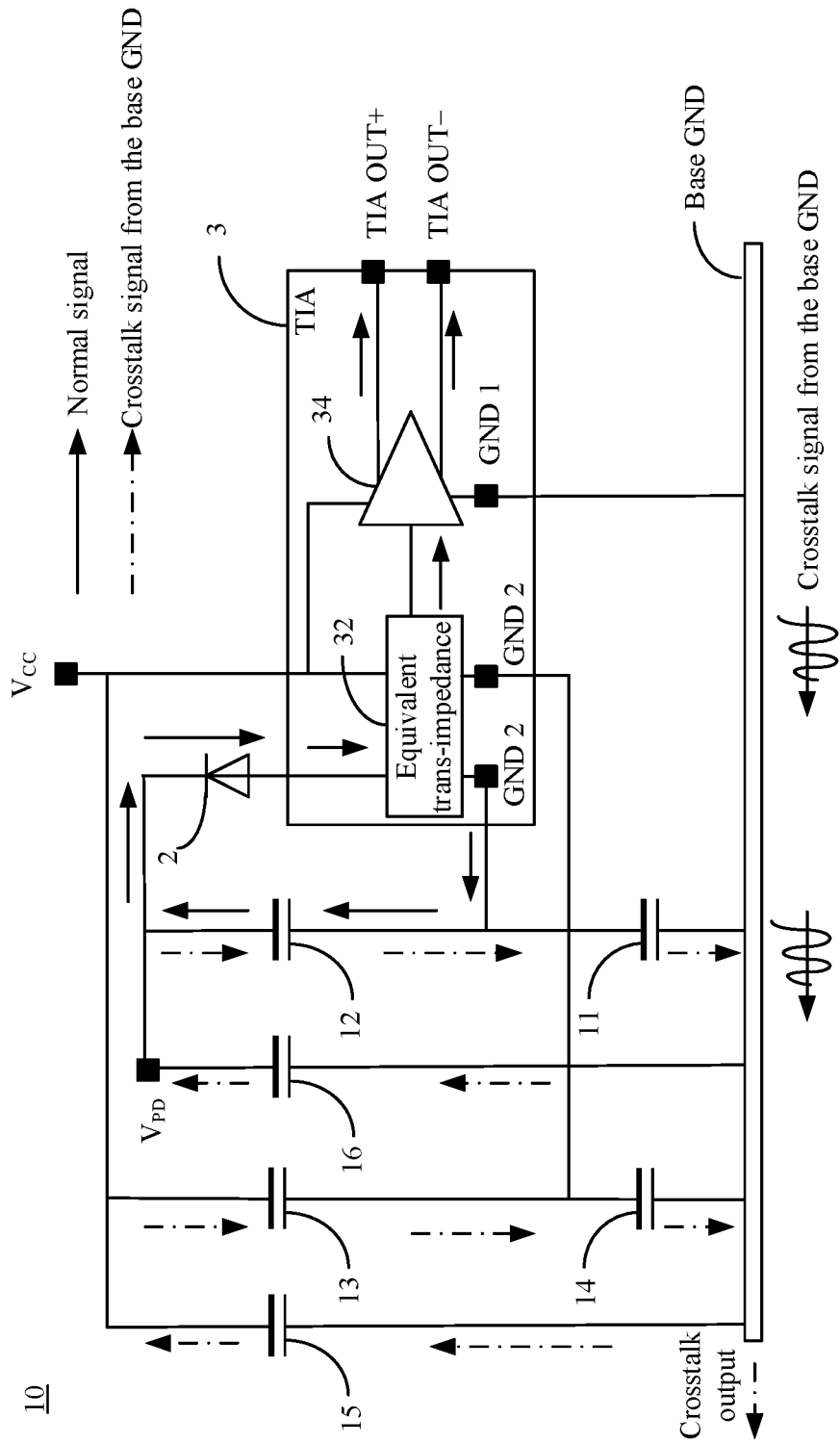

FIG. 18A and FIG. 18B are a schematic diagram of signal loops of the receiver optical sub-assembly 10 in FIG. 17. FIG. 18A shows a crosstalk signal from a power terminal $V_{CC}$ or a power terminal $V_{PD}$. FIG. 18B shows a crosstalk signal from a ground (base GND). As shown in FIG. 18A and FIG. 18B, the crosstalk signal from a power terminal $V_{CC}$ may be filtered out by the fifth filter component 15; and the crosstalk signal from the power terminal $V_{PD}$ may be filtered out by the sixth filter component 16. Alternatively, the crosstalk signal from the power terminal $V_{PD}$ may be filtered out by the first filter component 11 and the second filter component 12. The second filter component 12, the photodiode 2, and the trans-impedance amplifier 3 form an independent signal loop. In addition, the third filter component 13 and the trans-impedance amplifier 3 also form an independent signal loop. Because the first filter component 11 and the fourth filter component 14 have isolated the crosstalk signal from the ground and the crosstalk signal does not enter the foregoing two signal loops, electromagnetic interference from the ground is well suppressed, thereby improving a filtering capability for electromagnetic crosstalk.

A small part of crosstalk signals from the ground may further enter a power supply $V_{CC}$ power loop through the fifth filter component 15, and this part of crosstalk signals may be filtered out by the third filter component 13 and the fourth filter component 14. A small part of crosstalk signals from the ground enter a $V_{PD}$ power loop through the sixth filter component 16, and this part of crosstalk signals may be filtered out by the first filter component 11 and the second filter component 12.

Figure 19:
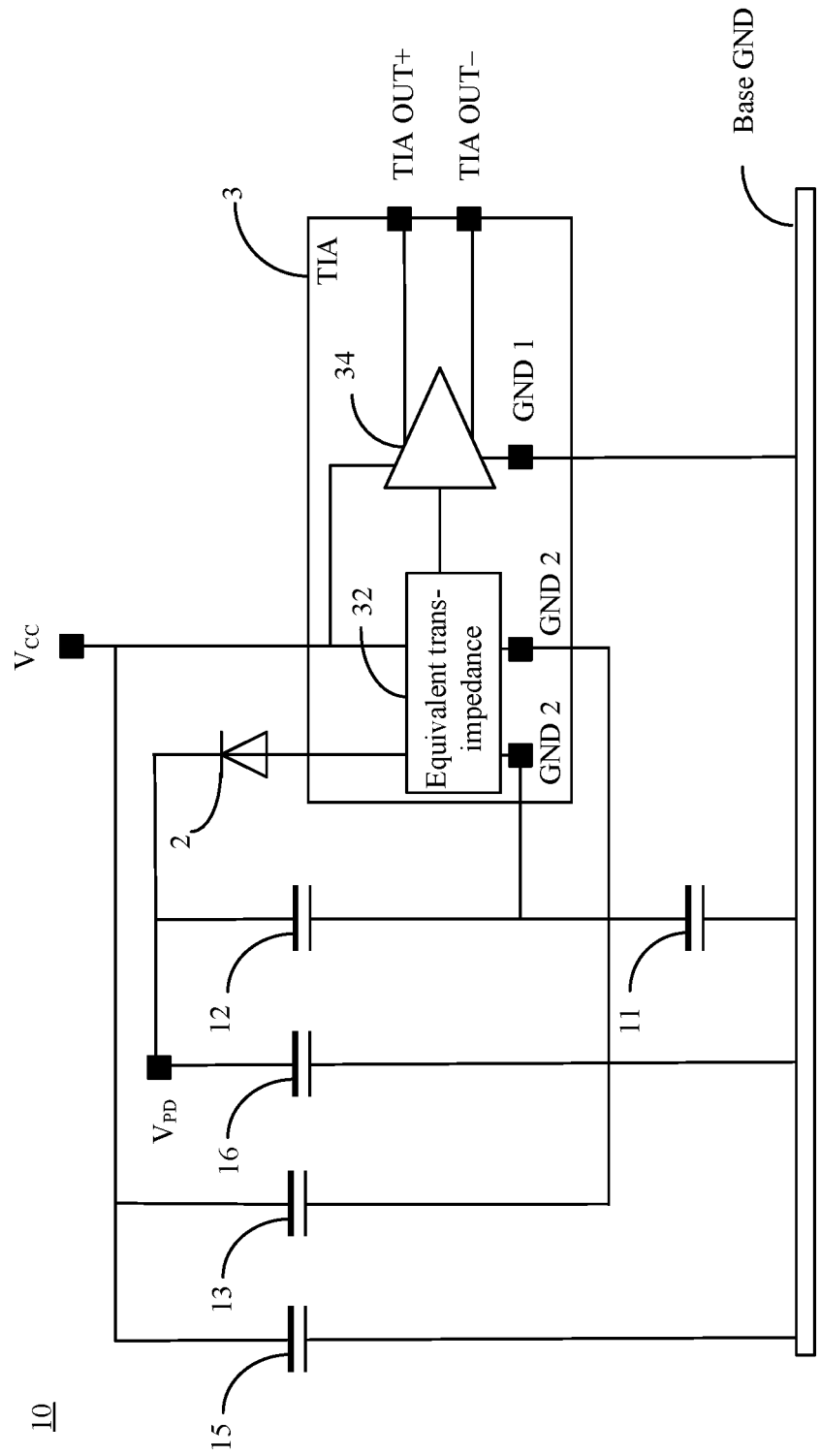
FIG. 19 is a schematic diagram of a circuit of a receiver optical sub-assembly according to another embodiment of this application.

FIG. 19 is a schematic diagram of a circuit of a receiver optical sub-assembly 10 according to another embodiment of this application. The receiver optical sub-assembly 10 in FIG. 19 is similar to that in FIG. 17. A difference is that the receiver optical sub-assembly 10 in FIG. 19 does not include the fourth filter component 14, or it may be understood as that the first filter component 11 and the fourth filter component 14 are combined into one filter component.

Figure 20:
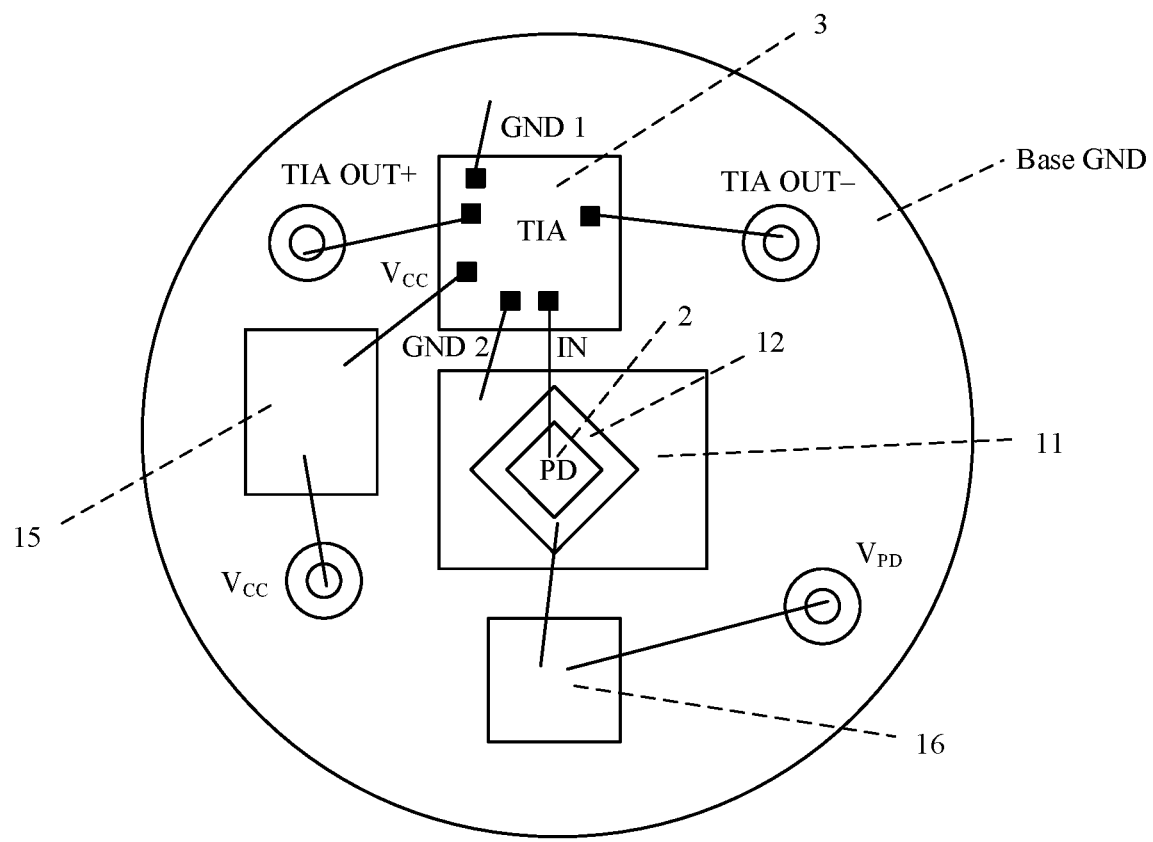
FIG. 20 is a schematic diagram of a structure of the receiver optical sub-assembly, packaged in a TO CAN form, in FIG. 15.
Figure 21:
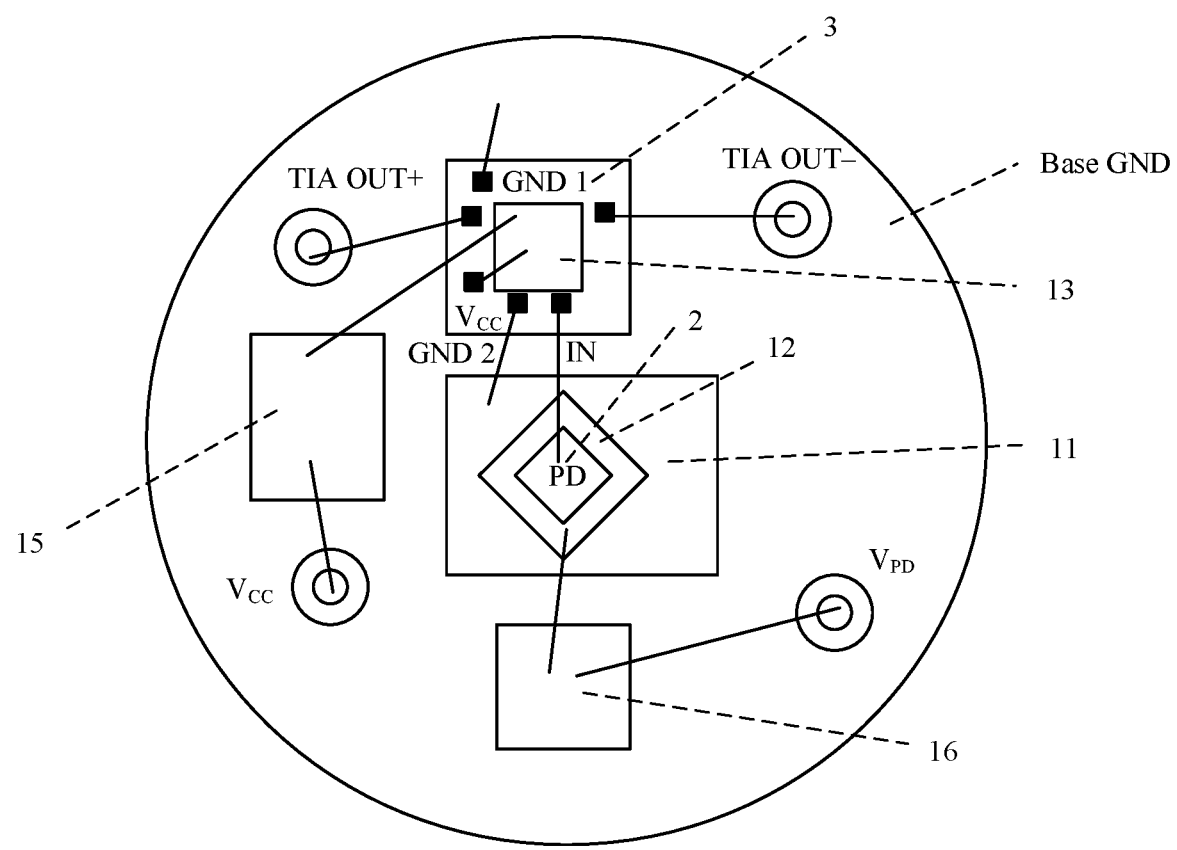
FIG. 21 is a schematic diagram of a structure of the receiver optical sub-assembly, packaged in a TO CAN form, in FIG. 19.

With reference to FIG. 20 and FIG. 21, the following continues to describe embodiments, corresponding to this application, of a receiver optical sub-assembly 10 packaged in a TO CAN form.

FIG. 20 is a schematic diagram of a structure of the receiver optical sub-assembly 10, packaged in a TO CAN form, in FIG. 15. As shown in FIG. 20, the receiver optical sub-assembly 10 includes a power supply $V_{CC}$ pin, a power supply $V_{PD}$ pin, a differential output terminal TIA OUT+ pin and a TIA OUT− pin of the trans-impedance amplifier 3. In addition, an entire bottom of the base is connected to a ground pin (not shown in the figure) as a ground cable. Specifically, the power supply $V_{CC}$ pin, an upper surface of the fifth filter component 15, and the power terminal of the trans-impedance amplifier 3 may be connected by using a bonding wire. Solid lines (that is, bonding wires) in FIG. 20 represent connection relationships between various components, and dashed lines are used to identity reference numerals of the various elements. A lower surface of the fifth filter component 15 is connected to the base ground GND through conductive adhesive or welding. The power supply $V_{PD}$ pin, an upper surface of the sixth filter component 16, and an upper surface of the second filter component 12 are connected by using a bonding wire. An upper surface of the second filter component 12 is connected to the negative electrode (a lower surface) of the photodiode 2 through conductive adhesive or welding. A positive electrode of the photodiode 2 is connected to an input terminal IN of the trans-impedance amplifier 3 by using a bonding wire. An upper surface of the first filter component 11 may be connected to a lower surface of the second filter component 12 through conductive adhesive or welding. A lower surface of the first filter component 11 may be connected to the base ground (base GND) through conductive adhesive or welding. The first ground terminal (GND 1) of the trans-impedance amplifier 3 is connected to the base ground (base GND). The second ground terminal (GND 2) of the trans-impedance amplifier 3 may be connected to the upper surface of the first filter component 11 by using a bonding wire.

FIG. 21 is a schematic diagram of a structure of the receiver optical sub-assembly 10, packaged in a TO CAN form, in FIG. 19. Compared with FIG. 20, the receiver optical sub-assembly 10 in FIG. 21 further includes a third filter component 13. For brevity, a portion in FIG. 21 with a same or similar structure as that in FIG. 20 is not described herein again. Solid lines (that is, bonding wires) in FIG. 21 represent connection relationships between various components, and dashed lines are used to identity reference numerals of the various elements. Optionally, a layer of conductive material may cover an upper surface of the trans-impedance amplifier 3, and the conductive material is connected to a ground terminal of the trans-impedance amplifier 3. The ground terminal may include the first ground terminal (GND 1) and/or the second ground terminal (GND 2) of the trans-impedance amplifier. Therefore, the various foregoing components may be connected to the ground terminal of the trans-impedance amplifier 3 through the conductive material connected to the upper surface of the trans-impedance amplifier 3. The conductive material may also be referred to as a grounding coating. The $V_{CC}$ pin is connected to the upper surface of the first filter component 11, the upper surface of the third filter component 13, and the power terminal of the trans-impedance amplifier 3 by using a bonding wire. The lower surface of the third filter component 13 is connected to the ground coating of the upper surface of the trans-impedance amplifier 3 through conductive adhesive or welding.

With reference to FIG. 20 and FIG. 21, the foregoing describes the structures of two types of receiver optical sub-assemblies packaged in the CO CAN form in the embodiments of this application. A person skilled in the art can understand that another receiver optical sub-assembly in the embodiments of this application may also be implemented by using a similar structure. For brevity, details are not described herein.

A person of ordinary skill in the art may be aware that, in combination with the examples described in the embodiments disclosed in this specification, units and algorithm steps may be implemented by electronic hardware or a combination of computer software and electronic hardware. Whether the functions are performed by hardware or software depends on particular applications and design constraint conditions of the technical solutions. A person skilled in the art may use different methods to implement the described functions for each particular application, but it should not be considered that the implementation goes beyond the scope of this application.

It may be clearly understood by a person skilled in the art that for the purpose of convenient and brief description, for a detailed working process of the described system, apparatus, and unit, refer to a corresponding process in the foregoing method embodiments. Details are not described herein again.

In the several embodiments provided in this application, it should be understood that the disclosed system, apparatus, and method may be implemented in other manners. For example, the apparatus embodiments described above are only examples. For example, division into the units is only logical function division, and may be other division during actual implementation. For example, a plurality of units or components may be combined or integrated into another system, or some features may be ignored or may not be performed. In addition, the displayed or discussed mutual couplings or direct couplings or communication connections may be implemented through some interfaces. The indirect couplings or communication connections between the apparatuses or units may be implemented in electrical, mechanical, or other forms.

The units described as separate components may be or may not be physically separate, and components displayed as units may be or may not be physical units, may be located in one position, or may be distributed on a plurality of network units. Some or all of the units may be selected according to actual requirements to achieve the objectives of the solutions of the embodiments.

In addition, functional units in the embodiments of this application may be integrated into one processing unit, or each of the units may exist alone physically, or two or more units are integrated into one unit.

When the functions are implemented in the form of a software functional unit and sold or used as an independent product, the functions may be stored in a computer-readable storage medium. Based on such an understanding, the technical solutions of this application essentially, or the part contributing to the conventional technology, or some of the technical solutions may be implemented in a form of a software product. The computer software product is stored in a storage medium, and includes several instructions for enabling a computer device (which may be a personal computer, a server, or a network device) to perform all or some of the steps of the methods described in the embodiments of this application. The foregoing storage medium includes any medium that can store program code, such as a USB flash drive, a removable hard disk, a read-only memory (Read-Only Memory, ROM), a random access memory (Random Access Memory, RAM), a magnetic disk, or an optical disc.

The foregoing descriptions are merely specific implementations of this application, but are not intended to limit the protection scope of this application. Any variation or replacement readily figured out by a person skilled in the art within the technical scope disclosed in this application shall fall within the protection scope of this application. Therefore, the protection scope of this application shall be subject to the protection scope of the claims.

What is claimed is:

1. A receiver optical sub-assembly, comprising a photodiode, a trans-impedance amplifier, and a first filter component, wherein:
the photodiode is configured to convert an optical signal into an electrical signal, a positive electrode of the photodiode is connected to an input terminal of the trans-impedance amplifier, and a negative electrode of the photodiode is configured to connect to a first power supply;
the trans-impedance amplifier is configured to amplify the electrical signal output by the photodiode, a power terminal of the trans-impedance amplifier is configured to connect to a second power supply, and a first ground terminal of the trans-impedance amplifier is configured to connect to an external ground;
a first terminal of the first filter component is connected to a second ground terminal of the trans-impedance amplifier, and a second terminal of the first filter component is configured to connect to the external ground; and
the trans-impedance amplifier comprises a voltage regulator connecting to the power terminal of the trans-impedance amplifier, and the negative electrode of the photodiode is connected to the voltage regulator.

2. The receiver optical sub-assembly according to claim 1, further comprising a base, wherein the base is configured to connect to the external ground, the first ground terminal of the trans-impedance amplifier is connected to the external ground through the base, and the second terminal of the first filter component is connected to the external ground through the base.

3. The receiver optical sub-assembly according to claim 1, further comprising a second filter component, wherein a first terminal of the second filter component is connected to the negative electrode of the photodiode, and a second terminal of the second filter component is connected to the first terminal of the first filter component.

4. The receiver optical sub-assembly according to claim 1, further comprising a third filter component, wherein a first terminal of the third filter component is connected to the power terminal of the trans-impedance amplifier, and a second terminal of the third filter component is connected to the second ground terminal of the trans-impedance amplifier.

5. The receiver optical sub-assembly according to claim 4, further comprising a fourth filter component, wherein a first terminal of the fourth filter component is connected to the second terminal of the third filter component, and a second terminal of the fourth filter component is connected to the external ground.

6. The receiver optical sub-assembly according to claim 1, further comprising a fifth filter component, wherein a first terminal of the fifth filter component is connected to the power terminal of the trans-impedance amplifier, and a second terminal of the fifth filter component is connected to the external ground.

7. The receiver optical sub-assembly according to claim 1, further comprising a sixth filter component, wherein a first terminal of the sixth filter component is connected to the negative electrode of the photodiode, and a second terminal of the sixth filter component is connected to the external ground.

8. The receiver optical sub-assembly according to claim 1, wherein a capacitance of the first filter component is greater than 100 picofarads (pF).

9. The receiver optical sub-assembly according to claim 1, wherein a scattering parameter of the first filter component on a crosstalk signal frequency band is greater than 20 decibels (dB).

10. The receiver optical sub-assembly according to claim 1, wherein the first filter component comprises a capacitor.

11. The receiver optical sub-assembly according to claim 1, wherein the second ground terminal of the trans-impedance amplifier comprises an input stage ground terminal of the trans-impedance amplifier.

12. The receiver optical sub-assembly according to claim 1, wherein the first power supply and the second power supply are a same outside power supply.

13. The receiver optical sub-assembly according to claim 1, wherein the first power supply and the second power supply are different outside power supplies.

14. The receiver optical sub-assembly according to claim 1, wherein the power terminal of the trans-impedance amplifier is configured to connect to an outside power supply.

15. A bi-directional optical sub-assembly comprising a receiver optical sub-assembly and a transmitter optical sub-assembly, wherein the receiver optical sub-assembly comprises a photodiode, a trans-impedance amplifier, and a first filter component, wherein:
the photodiode is configured to convert an optical signal into an electrical signal, a positive electrode of the photodiode is connected to an input terminal of the trans-impedance amplifier, and a negative electrode of the photodiode is configured to connect to a first power supply;
the trans-impedance amplifier is configured to amplify the electrical signal output by the photodiode, a power terminal of the trans-impedance amplifier is configured to connect to a second power supply, and a first ground terminal of the trans-impedance amplifier is configured to connect to an external ground;
a first terminal of the first filter component is connected to a second ground terminal of the trans-impedance amplifier, and a second terminal of the first filter component is configured to connect to the external ground; and
the trans-impedance amplifier comprises a voltage regulator connecting to the power terminal of the trans-impedance amplifier, and the negative electrode of the photodiode is connected to the voltage regulator.

16. An optical module comprising a bi-directional optical sub-assembly, wherein the bi-directional optical sub-assembly comprises a receiver optical sub-assembly and a transmitter optical sub-assembly, wherein the receiver optical sub-assembly comprises a photodiode, a trans-impedance amplifier, and a first filter component, wherein:
the photodiode is configured to convert an optical signal into an electrical signal, a positive electrode of the photodiode is connected to an input terminal of the trans-impedance amplifier, and a negative electrode of the photodiode is configured to connect to a first power supply;
the trans-impedance amplifier is configured to amplify the electrical signal output by the photodiode, a power terminal of the trans-impedance amplifier is configured to connect to a second power supply, and a first ground terminal of the trans-impedance amplifier is configured to connect to an external ground;
a first terminal of the first filter component is connected to a second ground terminal of the trans-impedance amplifier, and a second terminal of the first filter component is configured to connect to the external ground; and
the trans-impedance amplifier comprises a voltage regulator connecting to the power terminal of the trans-impedance amplifier, and the negative electrode of the photodiode is connected to the voltage regulator.

17. An optical network device comprising an optical module, wherein the optical sub-assembly comprises a bi-directional optical sub-assembly, wherein the bi-directional optical sub-assembly comprises a receiver optical sub-assembly, wherein the receiver optical sub-assembly comprises a photodiode, a trans-impedance amplifier, and a first filter component, wherein:
the photodiode is configured to convert an optical signal into an electrical signal, a positive electrode of the photodiode is connected to an input terminal of the trans-impedance amplifier, and a negative electrode of the photodiode is configured to connect to a first power supply;
the trans-impedance amplifier is configured to amplify the electrical signal output by the photodiode, a power terminal of the trans-impedance amplifier is configured to connect to a second power supply, and a first ground terminal of the trans-impedance amplifier is configured to connect to an external ground;
a first terminal of the first filter component is connected to a second ground terminal of the trans-impedance amplifier, and a second terminal of the first filter component is configured to connect to the external ground; and
the trans-impedance amplifier comprises a voltage regulator connecting to the power terminal of the trans-impedance amplifier, and the negative electrode of the photodiode is connected to the voltage regulator.

18. The optical network device according to claim 17, wherein the optical network device is an optical line terminal (OLT) or an optical network unit (ONU).

\* \* \* \* \*